(12) United States Patent
Inoue et al.

(10) Patent No.: US 8,320,162 B2
(45) Date of Patent: Nov. 27, 2012

(54) SEMICONDUCTOR DEVICE AND DRIVING METHOD OF THE SAME

(75) Inventors: Hiroki Inoue, Kanagawa (JP); Kiyoshi Kato, Kanagawa (JP); Takanori Matsuzaki, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 104 days.

(21) Appl. No.: 13/022,407

(22) Filed: Feb. 7, 2011

(65) Prior Publication Data

US 2011/0199816 A1  Aug. 18, 2011

(30) Foreign Application Priority Data

Feb. 12, 2010  (JP) .................................. 2010-028820

(51) Int. Cl.
*G11C 11/24* (2006.01)
(52) U.S. Cl. .................................. 365/149; 365/189.04
(58) Field of Classification Search .................. 365/149, 365/189.04, 189.09
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,712,817 A | 1/1998 | Suh | |
| 5,731,856 A | 3/1998 | Kim et al. | |
| 5,744,864 A | 4/1998 | Cillessen et al. | |
| 5,841,690 A * | 11/1998 | Shibutani et al. | 365/149 |
| 6,127,702 A | 10/2000 | Yamazaki et al. | |
| 6,294,274 B1 | 9/2001 | Kawazoe et al. | |
| 6,314,017 B1 * | 11/2001 | Emori et al. | 365/149 |
| 6,445,026 B1 | 9/2002 | Kubota et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,221,616 B2 | 5/2007 | Jeon | |
| 7,282,782 B2 | 10/2007 | Hoffman et al. | |
| 7,297,977 B2 | 11/2007 | Hoffman et al. | |

(Continued)

FOREIGN PATENT DOCUMENTS

EP  1 737 044 A1  12/2006

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Anh Phung
(74) *Attorney, Agent, or Firm* — Fish & Richardson P.C.

(57) ABSTRACT

An object is to provide a semiconductor device with a novel structure in which stored data can be held even when power is not supplied, and the number of times of writing is not limited. The semiconductor device is formed using a wide gap semiconductor and includes a potential change circuit which selectively applies a potential either equal to or different from a potential of a bit line to a source line. Thus, power consumption of the semiconductor device can be sufficiently reduced.

9 Claims, 17 Drawing Sheets

U.S. PATENT DOCUMENTS

| | | |
|---|---|---|
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0118597 A1* | 5/2010 | Song et al. ............... 365/149 |
| 2010/0148171 A1 | 6/2010 | Hayashi et al. |
| 2010/0193785 A1 | 8/2010 | Kimura |
| 2010/0276689 A1 | 11/2010 | Iwasaki |
| 2010/0279462 A1 | 11/2010 | Iwasaki |

FOREIGN PATENT DOCUMENTS

| | | |
|---|---|---|
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-054572 A | 2/1990 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-044297 A | 2/2001 |
| JP | 2001-053164 A | 2/2001 |
| JP | 2001-053167 A | 2/2001 |
| JP | 2001-093989 A | 4/2001 |
| JP | 2001-351386 A | 12/2001 |
| JP | 2002-076356 A | 3/2002 |
| JP | 2002-093924 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |
| WO | 2007/029844 A1 | 3/2007 |

OTHER PUBLICATIONS

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUs on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUs on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 3, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2011/051845, dated Apr. 26, 2011, 4 pages.

Written Opinion, PCT Application No. PCT/JP2011/051845, dated Apr. 26, 2011, 4 pages.

* cited by examiner

SEMICONDUCTOR DEVICE AND DRIVING METHOD OF THE SAME

TECHNICAL FIELD

The disclosed invention relates to a semiconductor device using a semiconductor element and a driving method thereof.

BACKGROUND ART

Memory devices using semiconductor elements are broadly classified into two categories: a volatile device that loses stored data when not powered, and a non-volatile device that holds stored data even when not powered.

A typical example of a volatile memory device is a dynamic random access memory (DRAM). A DRAM stores data in such a manner that a transistor included in a memory element is selected and charge is accumulated in a capacitor.

Owing to the above principle, charge in the capacitor is lost when data in a DRAM is read out; thus, another writing operation is necessary every time data is read out. Moreover, since leakage current (off-state current) flows between a source and a drain of a transistor included in a memory element when the transistor is in an off state, charge flows into or out even if the transistor is not selected, which makes a data holding period short. For that reason, another writing operation (refresh operation) is necessary at predetermined intervals, and it is difficult to adequately reduce power consumption. Furthermore, since stored data is lost when power supply stops, another memory device utilizing a magnetic material or an optical material is needed in order to hold the data for a long time.

Another example of a volatile memory device is a static random access memory (SRAM). An SRAM holds stored data by using a circuit such as a flip-flop and thus does not need refresh operation, which is an advantage over a DRAM. However, cost per storage capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary in a volatile memory device is not needed (e.g., see Patent Document 1).

However, in a flash memory, there is a problem in that a memory element does not function after a predetermined number of writing operations because a gate insulating layer included in the memory element deteriorates due to tunneling current generated in writing operations. In order to reduce effects of this problem, a method in which the number of writing operations is equalized among the memory elements can be employed, for example, but a complicated peripheral circuit is needed to employ this method. Moreover, even when such a method is employed, the fundamental problem about the lifetime is not resolved. In other words, a flash memory is not suitable for applications in which data is frequently rewritten.

In addition, high voltage is necessary for holding charge in the floating gate or removing the charge, and a circuit therefor is required. Further, it takes a relatively long time to inject or remove charge, and it is not easy to increase a speed of writing and erasing data.

[Reference]
Patent Document 1 Japanese Published Patent Application No. S57-105889

DISCLOSURE OF INVENTION

In view of the foregoing problems, an object of one embodiment of the disclosed invention is to provide a semiconductor device with a novel structure in which stored data can be held even when power is not supplied, and the number of times of writing is not limited.

In the disclosed invention, a semiconductor device is formed using a material which allows a sufficient reduction in off-state current of a transistor; for example, an oxide semiconductor material, which is a wide gap semiconductor, is used. When a semiconductor material which allows a sufficient reduction in off-state current of a transistor is used, the semiconductor device can hold data for a long period.

Further, one embodiment of the disclosed invention is a semiconductor device which is formed using a wide gap semiconductor and includes a potential change circuit which selectively applies a potential either equal to or different from a potential of a bit line to a source line. Thus, power consumption of the semiconductor device can be sufficiently reduced.

Specifically, examples of structures given below can be employed.

One embodiment of the present invention is a semiconductor device including a bit line, a source line, a potential change circuit, and a memory cell. The memory cell includes a first transistor including a first gate electrode, a first source electrode, a first drain electrode, and a first channel formation region; a second transistor including a second gate electrode, a second source electrode, a second drain electrode, and a second channel formation region; and a capacitor. The first channel formation region includes a semiconductor material different from a semiconductor material in the second channel formation region. The first gate electrode, the second drain electrode (or the second source electrode), and one of electrodes of the capacitor are electrically connected to each other to form a node which holds charge. The source line, one of terminals of the potential change circuit, and the first source electrode (or the first drain electrode) are electrically connected to each other. The bit line, the second source electrode (or the second drain electrode), and the first drain electrode (or the first source electrode) are electrically connected to each otehr. The potential change circuit selectively applies a potential to the source line, the potential being equal to or different from a potential of the bit line.

One embodiment of the present invention is a semiconductor device including a write word line, a read word line, a bit line, a source line, a potential change circuit, and a memory cell. The memory cell includes a first transistor including a first gate electrode, a first source electrode, a first drain electrode, and a first channel formation region; a second transistor including a second gate electrode, a second source electrode, a second drain electrode, and a second channel formation region; and a capacitor. The first channel formation region includes a semiconductor material different from a semiconductor material in the second channel formation region. The first gate electrode, the second drain electrode (or the second source electrode), and one of electrodes of the capacitor are electrically connected to each other to form a node which holds charge. The source line, one of terminals of the potential change circuit, and the first source electrode (or the first drain electrode) are electrically connected to each other. The bit line, the second source electrode (or the second drain electrode), and the first drain electrode (or the first source electrode) are electrically connected to each other. The read word line and the other of the electrodes of the capacitor are electrically connected to each other. The write word line and the second gate electrode are electrically connected to each other. The potential change circuit selectively applies a potential to the source line, the potential being equal to or different from a potential of the bit line.

In the above structure, the second channel formation region of the second transistor may include an oxide semiconductor. Further, the potential change circuit may have a function to apply a potential equal to a potential of the bit line to the source line, when a potential which turns the first transistor on is applied to the node.

Another embodiment of the present invention is a method for driving a semiconductor device where a gate electrode of a first transistor, a drain electrode (or a source electrode) of a second transistor, and one of electrodes of a capacitor are electrically connected to form a node which holds charge. In the method, a potential of a source electrode of the first transistor and a potential of a drain electrode of the first transistor are made equal to each other, when a potential which turns the first transistor on is applied to the node.

In the above structure, a channel formation region of the first transistor may include a semiconductor material different from a semiconductor material in a channel formation region of the second transistor. Further, the channel formation region of the second transistor may include an oxide semiconductor. Further, the potential of the source electrode (the drain electrode) of the first transistor and the potential of the drain electrode of the first transistor are made equal to each other by a potential change circuit controlling a potential of a source line connected to the source electrode of the first transistor.

Note that the term "equal" in describing potentials includes "substantially equal." The technical idea of the disclosed invention lies in that the potential difference between the bit line and the source line is sufficiently reduced and thus current flowing in the bit line and the source line is suppressed. Consequently, "substantially equal" potentials, e.g., potentials which enable power consumption to be sufficiently reduced (to one hundredth or less) compared to the case where the potential of the source line is fixed to GND or the like, are included. In addition, potential deviation due to wire resistance or the like are reasonably acceptable.

Note that although the transistor may be formed using an oxide semiconductor in the above description, the disclosed invention is not limited to this. A material which can realize the off-state current characteristics equivalent to those of the oxide semiconductor, such as a wide gap material like silicon carbide (specifically, a semiconductor material whose energy gap Eg is larger than 3 eV) may be used.

Note that in this specification and the like, the term such as "over" or "below" does not necessarily mean that a component is placed "directly over" or "directly below" another component. For example, the expression "a gate electrode over a gate insulating layer" does not exclude the case where another component is provided between the gate insulating layer and the gate electrode.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" are formed in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be interchanged in this specification.

Note that in this specification and the like, the term "electrically connected" includes the case where components are connected through an object having any electric function. There is no particular limitation on the object having any electric function as long as electric signals can be transmitted and received between the components connected through the object.

Examples of the object having any electric function include a switching element such as a transistor, a resistor, an inductor, a capacitor, and an element with a variety of functions as well as an electrode and a wiring.

Since the off-state current of a transistor including an oxide semiconductor is extremely small, stored data can be held for an extremely long period by using the transistor. In other words, refresh operation becomes unnecessary or the frequency of the refresh operation can be extremely low, which leads to a sufficient reduction in power consumption. Moreover, stored data can be held for a long period even when power is not supplied (note that a potential is preferably fixed).

Further, a semiconductor device according to the disclosed invention does not need high voltage for writing data, and deterioration of the element does not become a problem. For example, unlike a conventional non-volatile memory, it is not necessary to inject and extract electrons into and from a floating gate, and thus a problem such as deterioration of a gate insulating layer does not occur at all. That is, the semiconductor device according to the disclosed invention does not have a limit on the number of times of rewriting, which has been a problem of a conventional non-volatile memory, and thus has drastically improved reliability. Furthermore, since data is written by turning on or off the transistor, high-speed operation can be easily realized. Additionally, there is an advantage that operation for erasing data is not needed.

Since a transistor including a material which is not an oxide semiconductor can operate at sufficiently high speed, when it is combined with a transistor including an oxide semiconductor, a semiconductor device can perform operation (e.g., reading data) at sufficiently high speed. Further, a transistor including a material which is not an oxide semiconductor can suitably realize a variety of circuits (e.g., a logic circuit or a driver circuit) which needs to operate at high speed.

Thus, a semiconductor device having a novel feature can be realized by provision of both the transistor including a material which is not an oxide semiconductor (a transistor capable of operation at sufficiently high speed, in general) and the transistor including an oxide semiconductor (a transistor whose off-state current is sufficiently small, in general).

Further, a potential of a source line and a potential of a bit line are made equal to each other when data is written, whereby a semiconductor device with sufficiently reduced power consumption can be realized.

BRIEF DESCRIPTION OF DRAWINGS

FIG. 2 is a circuit diagram of a semiconductor device.

BEST MODE FOR CARRYING OUT THE INVENTION

Figures 1, 1A:
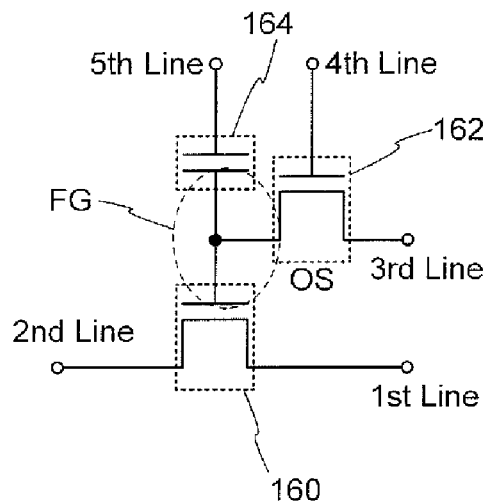
FIGS. 1A-1, 1A-2, and 1B are circuit diagrams of a semiconductor device.

Hereinafter, embodiments and examples of the present invention are described with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments and examples to be given below.

Note that the position, the size, the range, or the like of each structure illustrated in drawings and the like is not accurately represented in some cases for easy understanding. The disclosed invention is thus not necessarily limited by the position, size, range, or the like illustrated in the drawings and the like.

In this specification and the like, ordinal numbers such as first, second, and third are used in order to avoid confusion among components, and the terms do not limit the components numerically.

(Embodiment 1)

In this embodiment, a basic circuit structure and operation of a semiconductor device according to one embodiment of the disclosed invention will be described with reference to FIGS. 1A-1, 1A-2, and 1B and FIG. 2. Note that in each of the circuit diagrams, "OS" may be written beside a transistor in order to indicate that the transistor includes an oxide semiconductor.

<Basic Circuit 1>

First, the most basic circuit structure and its operation will be described with reference to FIGS. 1A-1, 1A-2, and 1B. In the semiconductor device in FIG. 1A-1, a first wiring (a 1st line) and a source electrode (or a drain electrode) of a transistor 160 are electrically connected to each other, and a second wiring (a 2nd line) and the drain electrode (or the source electrode) of the transistor 160 are electrically connected to each other. In addition, a third wiring (a 3rd line) and a source electrode (or a drain electrode) of a transistor 162 are electrically connected to each other, and a fourth wiring (a 4th line) and a gate electrode of the transistor 162 are electrically connected to each other. In addition, a gate electrode of the transistor 160 and the drain electrode (or the source electrode) of the transistor 162 are electrically connected to one electrode of a capacitor 164, and a fifth wiring (a 5th line) and the other electrode of the capacitor 164 are electrically connected to each other.

Here, a transistor including an oxide semiconductor is used as the transistor 162, for example. Off-state current of a transistor including an oxide semiconductor is extremely small. Therefore, when the transistor 162 is in an off state, a potential in the gate electrode of the transistor 160 can be held for a very long time. The capacitor 164 facilitates holding of charge applied to the gate electrode of the transistor 160 and reading of the held data.

Note that there is no particular limitation on the transistor 160. In order to increase the speed of reading data, it is preferable to use, for example, a transistor with high switching speed, such as a transistor formed using single crystal silicon.

Figure 1B:
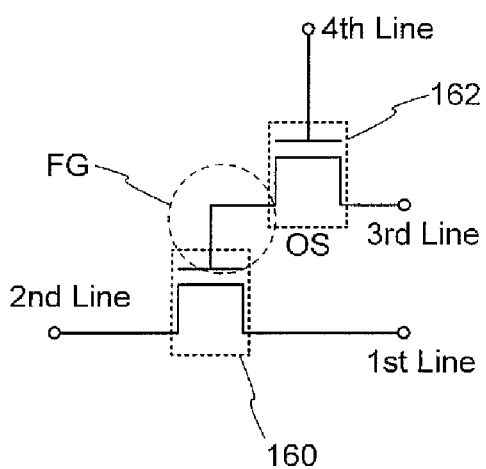

Alternatively, the capacitor 164 may be omitted as in FIG. 1B.

The semiconductor device in FIG. 1A-1 can write, hold, and read data as described below, utilizing a characteristic in which the potential of the gate electrode of the transistor 160 can be held.

Firstly, writing and holding of data will be described. The potential of the fourth wiring is set to a potential at which the transistor 162 is turned on, whereby the transistor 162 is turned on. Thus, the potential of the third wiring is applied to the gate electrode of the transistor 160 and the capacitor 164. That is, predetermined charge is applied to the gate electrode of the transistor 160 (writing of data). Here, charge for applying either two different levels of potential (hereinafter charge for applying a low potential is referred to as charge $Q_L$ and charge for applying a high potential is referred to as charge $Q_H$) is applied. Note that charge for applying three or more different levels of potential may be employed to improve storage capacity. After that, the potential of the fourth wiring is set to a potential at which the transistor 162 is turned off, whereby the transistor 162 is turned off. Thus, the charge applied to the gate electrode of the transistor 160 is held (holding of data).

Since the off-state current of the transistor 162 is extremely small, the charge in the gate electrode of the transistor 160 is held for a long period.

Secondly, reading of data will be described. While a predetermined potential (a fixed potential) is applied to the first wiring, an appropriate potential (a read-out potential) is applied to the fifth wiring, whereby the potential of the second wiring changes depending on the amount of charge held in the gate electrode of the transistor 160. This is because in general, when the transistor 160 is an n-channel transistor, an apparent threshold value $V_{th\_H}$ in the case where $Q_H$ is held in the gate electrode of the transistor 160 is lower than an apparent threshold value $V_{th\_L}$ in the case where $Q_L$ is held in the gate electrode of the transistor 160. Here, an apparent threshold value refers to the potential of the fifth wiring which is needed to turn on the transistor 160. Thus, by setting the potential of the fifth wiring to a potential $V_0$ which is between $V_{th\_H}$ and $V_{th\_L}$, charge held in the gate electrode of the transistor 160 can be determined. For example, in the case where $Q_H$ is applied in writing, when the potential of the fifth wiring is set to $V_0$ ($>V_{th\_H}$), the transistor 160 is turned on. In the case where $Q_L$ is applied in writing, even when the potential of the fifth wiring is set to $V_0$ ($<V_{th\_L}$), the transistor 160 remains off. Thus, the data held can be read by measuring the potential of the second wiring.

Note that in the case where memory cells are arrayed, it is necessary to read out data only from an intended memory cell. In the case where data of predetermined memory cell is read out and data of the other memory cells is not read out, a potential at which the transistor 160 is in an off state regardless of the state of the gate electrode, that is, a potential lower than $V_{th\_H}$, may be applied to the fifth wirings of the memory cells whose data is not to be read. Alternatively, a potential at which the transistor 160 is in an on state regardless of the state of the gate electrode, that is, a potential higher than $V_{th\_L}$, may be applied to the fifth wirings of the memory cells whose data is not to be read.

Thirdly, rewriting of data will be described. Rewriting of data is performed in a manner similar to that of the writing and holding of data. In other words, the potential of the fourth wiring is set to a potential at which the transistor 162 is turned on, whereby the transistor 162 is turned on. Accordingly, the potential of the third wiring (a potential for new data) is applied to the gate electrode of the transistor 160 and the capacitor 164. After that, the potential of the fourth wiring is set to a potential at which the transistor 162 is turned off, whereby the transistor 162 is turned off. Thus, charge for the new data is applied to the gate electrode of the transistor 160.

In the semiconductor device according to the disclosed invention, data can be directly rewritten by another writing of data as described above. Therefore, extracting of charge from a floating gate with the use of high voltage, which is needed in a flash memory or the like, is not needed and thus a reduction in operation speed caused by erasing operation, can be suppressed. In other words, high-speed operation of the semiconductor device can be realized.

Note that the drain electrode (or the source electrode) of the transistor 162 is electrically connected to the gate electrode of the transistor 160, and thereby has an effect similar to that of a floating gate of a floating-gate transistor which is used as a non-volatile memory element. Hereinafter, the portion where the drain electrode (or the source electrode) of the transistor 162 and the gate electrode of the transistor 160 are electrically connected to each other is called a node FG in some cases. When the transistor 162 is off, the node FG can be regarded as being embedded in an insulator and charge is held in the node FG. The off-state current of the transistor 162 including an oxide semiconductor is smaller than or equal to one hundred thousandth of the off-state current of a transistor including a silicon semiconductor or the like; thus, loss of the charge accumulated in the node FG due to leakage current of the transistor 162 is negligible. That is, with the transistor 162 including an oxide semiconductor, a non-volatile memory device which can hold data without power supply can be realized.

For example, when the off-state current of the transistor 162 is smaller than or equal to 10 zA (1 zA (zeptoampere) is $1 \times 10^{-21}$ A) at room temperature (25° C.) and the capacitance value of the capacitor 164 is approximately 10 fF, data can be held for $10^4$ seconds or longer. It should be appreciated that the holding time changes depending on the transistor characteristics and the capacitance value.

In the semiconductor device of the disclosed invention, a problem of deterioration of a gate insulating film (a tunnel insulating film), which occurs in a conventional floating-gate transistor, does not exist. That is, deterioration of a gate insulating film due to injection of electrons into a floating gate, which has been regarded as a problem, can be solved. This means that there is no limit on the number of times of writing in principle. In addition, high voltage which is needed for writing or erasing data in a conventional floating-gate transistor is not necessary.

Figures 1, 1A, 2:
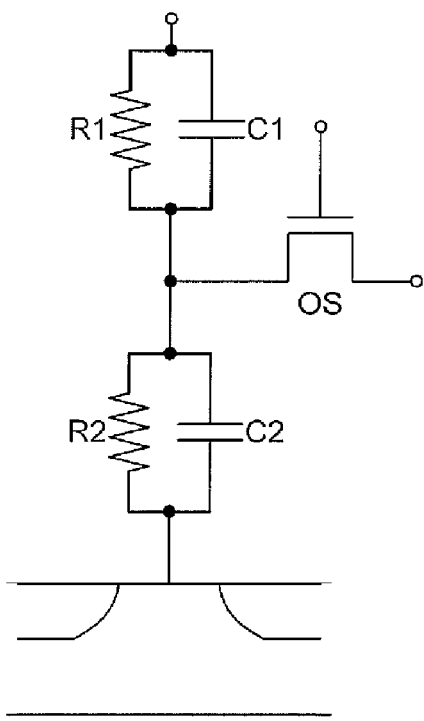
Figure 2:
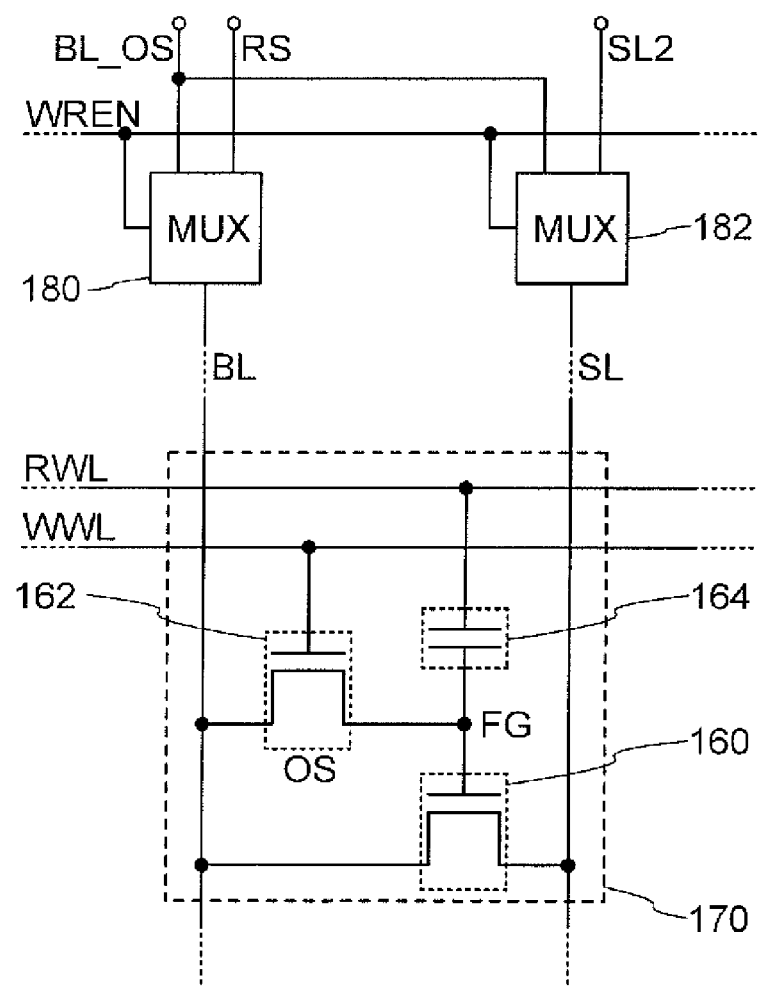

The components such as transistors in the semiconductor device in FIG. 1A-1 can be regarded as including a resistor and a capacitor as shown in FIG. 1A-2. That is, in FIG. 1A-2, the transistor 160 and the capacitor 164 are each regarded as including a resistor and a capacitor. R1 and C1 denote the resistance value and the capacitance value of the capacitor 164, respectively. The resistance value R1 corresponds to the resistance value of an insulating layer included in the capacitor 164. R2 and C2 denote the resistance value and the capacitance value of the transistor 160, respectively. The resistance value R2 corresponds to the resistance value of a gate insulating layer at the time when the transistor 160 is on. The capacitance value C2 corresponds to the capacitance value of so-called gate capacitance (capacitance between the gate electrode and the source electrode or drain electrode and capacitance between the gate electrode and the channel formation region).

A charge holding period (also referred to as a data holding period) is determined mainly by off-state current of the transistor 162 under the condition where gate leakage current of the transistor 162 is sufficiently small, R1 is greater than or equal to ROS (R1≧ROS), and R2 is greater than or equal to ROS (R2≧ROS), where ROS is the resistance value (also referred to as effective resistance) between the source electrode and the drain electrode at the time when the transistor 162 is off.

On the other hand, when the condition is not satisfied, it would be difficult to ensure a sufficient holding period even if the off-state current of the transistor 162 is small enough. This is because leakage current other than the off-state current of the transistor 162 (e.g., leakage current generated between the source electrode and the gate electrode) would be large. Thus, it can be said that the semiconductor device disclosed in this embodiment desirably satisfies the relation where R1 is greater than or equal to ROS (R1≧ROS), and R2 is greater than or equal to ROS (R2≧ROS).

It is desirable that C1 be greater than or equal to C2 (C1≧C2). This is because by increasing C1, the potential of the fifth wiring can be effectively applied to the node FG when the potential in the node FG is controlled by the fifth wiring, and thus the difference between the potentials applied to the fifth wiring (e.g., a potential of reading and a potential of not reading) can be reduced.

As described above, when the above relation is satisfied, a more favorable semiconductor device can be realized. Note that R1 and R2 are determined by the gate insulating layer included in the transistor 160 and an insulating layer included in the capacitor 164, respectively. Similarly, C1 and C2 are determined by the gate insulating layer of the transistor 160 and an insulating layer included in the capacitor 164, respectively. Therefore, the material, the thickness, and the like of the gate insulating layer are desirably set as appropriate so that the above relation may be satisfied.

In the semiconductor device described in this embodiment, the node FG has an effect similar to a floating gate of a floating-gate transistor in a flash memory or the like, but the node FG of this embodiment has a feature which is essentially different from that of the floating gate in the flash memory or the like.

In a flash memory, since a potential applied to a control gate is high, it is necessary to keep a proper distance between cells in order to prevent the potential from affecting a floating gate of the adjacent cell. This is one of the factors inhibiting high integration of the semiconductor device. The factor is due to a basic principle of a flash memory that tunneling current is generated by application of a high electric field.

In contrast, the semiconductor device according to this embodiment is operated by switching of a transistor including an oxide semiconductor and does not use the above principle of charge injection by tunneling current. That is, unlike a flash memory, a high electric field for charge injection is not necessary. Accordingly, an effect of a high electric field for a control gate on an adjacent cell does not need to be taken into account, and thus high integration can be facilitated.

In addition, it is also advantage over a flash memory that a high electric field is unnecessary and a large peripheral circuit (such as a booster circuit) is unnecessary. For example, the maximum value of voltage applied to the memory cell according to this embodiment (the difference between the highest potential and the lowest potential applied to terminals of the memory cell at the same time) can be 5 V or lower, preferably 3 V or lower, in each memory cell in the case where two-level (one-bit) data is written.

In the case where the dielectric constant $\epsilon r1$ of the insulating layer included in the capacitor 164 is different from the dielectric constant $\epsilon r2$ of the insulating layer included in the transistor 160, C1 can easily be made greater than or equal to C2 (C1≧C2) while S1 which is the area of the insulating layer included in the capacitor 164 and S2 which is the area of an insulating layer forming gate capacitance of the transistor 160 satisfy the relation where 2×S2 is greater than or equal to S1 (2×S2≧S1), desirably S2 is greater than or equal to S1 (S2≧S1). In other words, C1 can easily be made greater than or equal to C2 while the area of the insulating layer included in the capacitor 164 is small. Specifically, for example, when a film formed of a high-k material such as hafnium oxide or a stack of a film formed of a high-k material such as hafnium oxide and a film formed of an oxide semiconductor is used for the insulating layer included in the capacitor 164, $\epsilon r1$ can be set to 10 or more, preferably 15 or more, and when a film formed of silicon oxide is used for the insulating layer forming the gate capacitance, $\epsilon r2$ can be set to 3 to 4 inclusive.

Combination of such structures enables higher integration of the semiconductor device according to the disclosed invention.

Note that in addition to the increase in the degree of integration, a multilevel technique can be employed in order to increase the storage capacity of the semiconductor device. For example, three or more levels of data are written to one memory cell, whereby the storage capacity can be increased as compared to the case where two-level (one-bit) data is written. The multilevel technique can be achieved by, for example, supplying charge Q to the gate electrode of the first transistor, in addition to charge $Q_L$ for supplying a low potential and charge $Q_H$ for supplying a high potential. In this case, enough storage capacity can be ensured even in a circuit structure with a relatively large scale (e.g., 15 $F^2$ to 50 $F^2$ inclusive; F is the minimum feature size).

Note that an n-channel transistor (an n-type transistor) in which electrons are carriers is used in the above description, but it will be appreciated that a p-channel transistor in which holes are majority carriers can be used instead of the n-channel transistor.

<Basic Circuit 2>

Next, a specific circuit structure and its operation will be described with reference to FIG. 2. The structure of a memory cell 170 in FIG. 2 is similar to that in FIG. 1A-1. The first wiring in FIG. 1A-1 corresponds to a source line SL in FIG. 2. The fourth wiring in FIG. 1A-1 corresponds to a write word line WWL in FIG. 2. The fifth wiring in FIG. 1A-1 corresponds to a read word line RWL in FIG. 2. Note that a bit line BL in FIG. 2 corresponds to both the second wiring and the third wiring in FIG. 1A-1.

In FIG. 2, the bit line BL is connected to a multiplexer (MUX) 180. The multiplexer 180 is also connected to a write and read control signal line WREN, an input signal line BL_OS, and a read circuit input signal line RS, as well as the bit line BL. The write and read control signal line WREN transmits a signal for changing signal path in the multiplexer. The input signal line BL_OS transmits data signal which is written to the memory cell 170. The read circuit input signal line RS transmits signal from a read circuit.

In addition, in FIG. 2, the source line SL is connected to the multiplexer 182. The multiplexer 182 is connected to the write and read control signal line WREN, the input signal line BL_OS, and a second source line SL2, as well as the source line SL. The second source line SL2 transmits a signal which is applied to the source line SL when data is read.

The multiplexer 180 and the multiplexer 182 have a function of changing signal paths in accordance with the write and read control signal line WREN. The multiplexer is also referred to as a selector.

Writing, holding, and reading of data are performed similarly to the case of FIGS. 1A-1, 1A-2, and 1B. Here, as one example, the case where either a power supply potential VDD or a reference potential GND is applied to the node FG will be described. Note that data "1" is held when the power supply potential VDD is applied to the node FG, whereas data "0" is held when the reference potential GND is applied to the node FG Further, a potential of the second source line SL2 is set to GND.

Specific write operation will be described. A potential of the read word line RWL connected to the memory cell 170 is set to GND and a potential of the write word line WWL connected to the memory cell 170 is set to VDD, whereby the memory cell 170 is selected.

Then, signal paths in the multiplexer 180 and the multiplexer 182 are changed so that data of the input signal line BL_OS to be written may be transmitted to the bit line BL through the multiplexer 180 and to the source line SL through the multiplexer 182. In other words, a signal for such operation is input to the write and read control signal line WREN to change the signal paths in the multiplexer 180 and the multiplexer 182.

The operation is characterized in that the potential of the bit line BL and the potential of the source line SL are made equal to each other when data is written. This can reduce power consumption due to current flowing in the bit line BL and the source line SL even when a potential at which the first transistor 160 is on is applied to the node FG. The above multiplexer is one of the circuits which enable such operation. From the viewpoint of the potential of the source line SL, the operation can be regarded as a change in potential of the source line SL. Thus, the circuit having such a function can be generally referred to as a "potential change circuit." Note that the "potential change circuit" is not limited to a multiplexer.

Note that in this specification, the term "equal" describing potentials includes "substantially equal." The technical idea of the disclosed invention lies in that the potential difference between the bit line BL and the source line SL is sufficiently reduced and thus current flowing in the bit line BL and the source line SL is suppressed. Consequently, "substantially equal" potentials include, for example, potentials which enable power consumption to be sufficiently reduced (to one hundredth or less) compared to the case where the potential of the source line SL is fixed to GND. In addition, potential deviation due to wire resistance or the like are reasonably acceptable.

Note that in order to write data "0" to the memory cell 170, GND is applied to the input signal line BL_OS, whereas in order to write data "1" to the memory cell 170, a potential VDD+α is applied to the input signal line BL_OS, taking voltage drop in the transistor 162 into consideration.

Data is held by setting the potentials of the read word line RWL and the write word line WWL to a potential lower than GND by VDD (hereinafter, the potential is referred to as VL).

When the potential of the read word line RWL is decreased from GND to VL, the potential in the node FG is decreased by VDD (=GND−VL) due to capacitive coupling with the capacitor 164. Accordingly, when VDD corresponding to data "1" has been applied to the node FG, the potential in the node FG is decreased by VDD to be GND, whereas when GND corresponding to data "0" has been applied to the node FG, the potential in the node FG is decreased by VDD to be VL (=GND−VDD).

Since VL is applied to the write word line WWL, the transistor 162 is turned off regardless of whether data "1" or data "0" has been written. Since the off-state current of the transistor 162 is significantly small, the charge in the gate electrode of the transistor 160 is held for a long period.

Data is read out by setting the potential of the read word line RWL to GND and the potential of the write word line WWL to VL.

When the potential of the read word line RWL is increased from VL to GND, the potential in the node FG is increased by VDD (=GND−VL) due to capacitive coupling with the capacitor 164. Accordingly, when VDD corresponding to data "1" has been applied to the node FG, the potential in the node FG is increased by VDD to be VDD, whereas when GND corresponding to data "0" has been applied to the node FG, the potential in the node FG is increased by VDD to be GND (VL+VDD).

Note that to read out data, the signal path in the multiplexer 180 is changed so that the potential of the bit line BL may be transmitted to the read circuit input signal line RS through the multiplexer 180. In other words, a signal for such operation is input to the write and read control signal line WREN to change the signal path in the multiplexer 180.

In addition, the signal path in the multiplexer 182 is changed so that the source line SL is connected to the second source line SL2 through the multiplexer 182. In other words, a signal for such operation is input to the write and read control signal line WREN to change the signal path in the multiplexer 182. Thus, GND is applied to the source line SL.

By the above reading operation, in the case where data "1" is written to the memory cell 170, the transistor 160 is turned on and the potential of the bit line BL is decreased; whereas in the case where data "0" is written to the memory cell 170, the transistor 160 is turned off and the potential of the bit line BL at the beginning of the reading operation is kept or the potential of the bit line BL is increased. Note that it depends on the circuit connected to the read circuit input signal line RS whether the potential of the bit line BL is kept or increased.

As described above, in the semiconductor device having the circuit structure illustrated in FIG. 2, current flowing in the source line SL and the bit line BL during the data writing operation can be suppressed. Consequently, power consumption during the data writing operation can be reduced. Note that the technical idea of the disclosed invention lies in that a potential difference between the bit line BL and the source line SL is sufficiently reduced, and thus current flowing in the bit line BL and the source line SL is suppressed. The circuit structure is not limited to the above one as long as the technical idea can be applied.

The structures, methods, and the like described in this embodiment can be combined as appropriate with any of the structures and methods described in the other embodiments.

(Embodiment 2)

In this embodiment, an application example of the semiconductor device described in the above embodiment will be described. Specifically, an example of a semiconductor device in which the semiconductor devices described in the above embodiment are arranged in a matrix will be described with reference to FIGS. 3 and 4.

Figure 3:
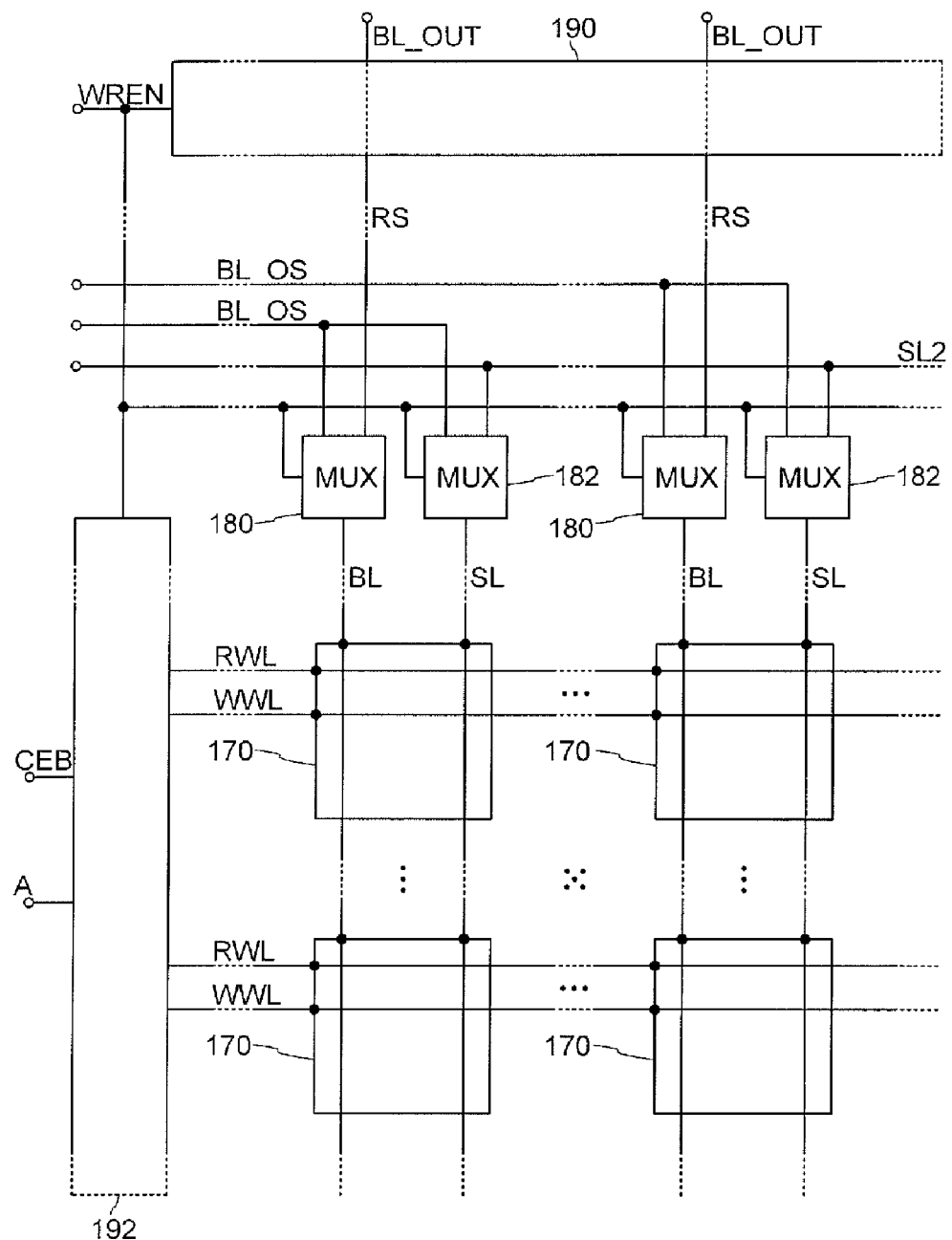
FIG. 3 is a circuit diagram of a semiconductor device.

FIG. 3 illustrates an example of a circuit diagram of a semiconductor device including m×n memory cells 170.

The semiconductor device according to this embodiment includes m (m is an integral greater than or equal to 2) write word lines WWLs, m read word lines RWLs, n (n is an integral greater than or equal to 2) bit lines BLs, n source lines SLs, a memory cell array in which the memory cells 170 are arranged in a matrix of m rows (in a vertical direction)×n columns (in a horizontal direction), multiplexers 180 connected to respective n bit lines BLs, multiplexers 182 connected to respective n source lines SLs, a first driver circuit 190, and a second driver circuit 192. Here, the structures described in the above embodiment (the structure illustrated in FIG. 2) are applied to the memory cells 170, the multiplexers 180, and the multiplexers 182. That is, the basic structure and operation are similar to those in FIG. 2.

Output signal lines BL_OUT, the read circuit input signal lines RS, and the write and read control signal line WREN are connected to the first driver circuit 190. Here, the output signal line BL_OUT is a line which outputs data from the memory cell.

A chip-enable bar signal line CEB, an address selection signal line A, a write and read control signal line WREN, the write word lines WWLs, and the read word lines RWLs are connected to the second driver circuit 192. Here, the chip-enable bar signal line CEB is a line which transmits a signal which activates the second driver circuit 192. For example, when the potential of the chip-enable bar signal line CEB is low, the second driver circuit 192 is activated and outputs a high potential. When the potential of the chip-enable bar signal line CEB is high, the second driver circuit 192 outputs a low potential. The address selection signal line A is a line which transmits a signal for selecting a row address.

Figure 4:
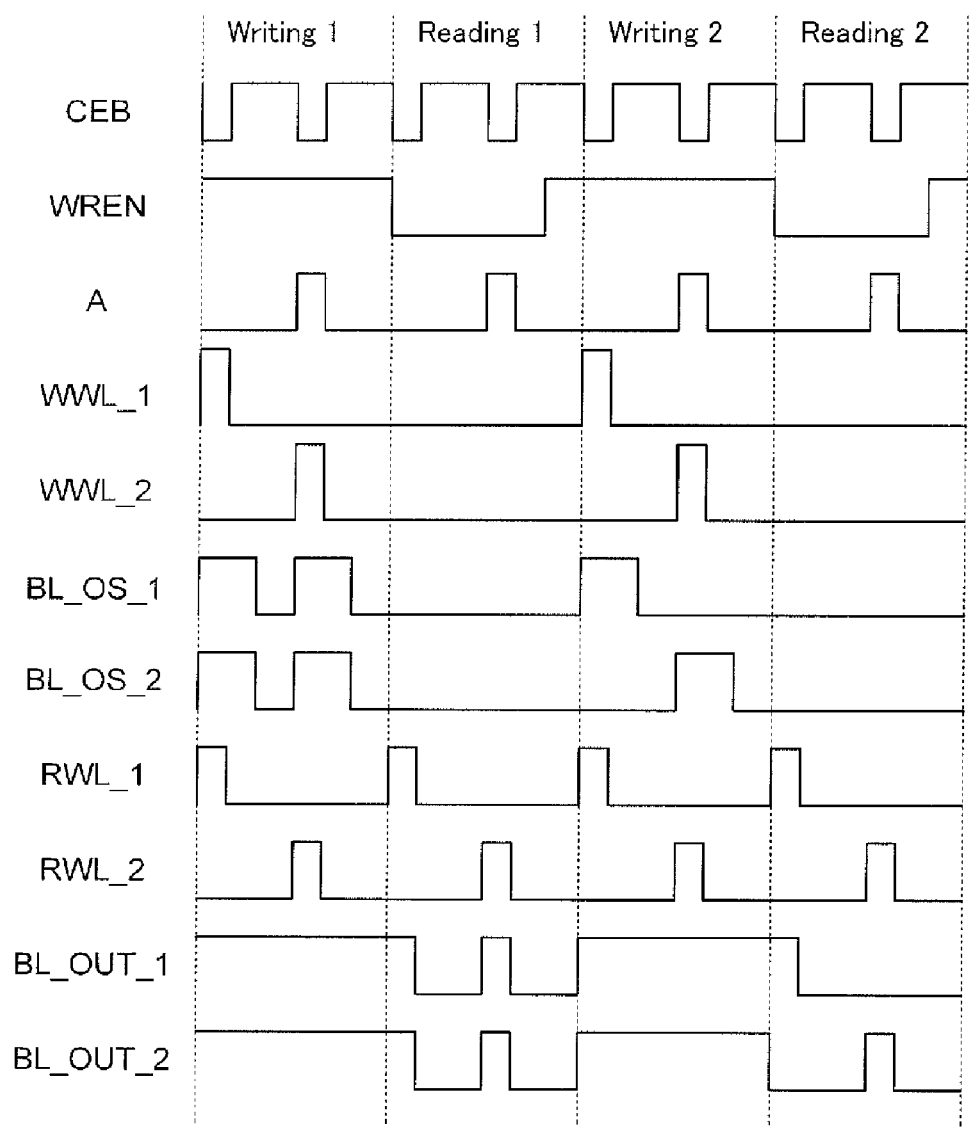
FIG. 4 is a timing diagram.

FIG. 4 is an example of a timing diagram of the semiconductor device in FIG. 3. CEB, WREN, and the like in the timing diagram denote the lines to which the potentials in the timing diagram are applied. Lines having a similar function are distinguished by "_1", "_2", and the like added to the end of their names. Note that for the sake of simplicity, the semiconductor device described here is an example where the memory cells 170 are arranged in 2 (rows)×2 (columns), but the disclosed invention is not limited to this.

The timing diagram in FIG. 4 shows the relation of the potentials of the lines in the case where data "1" is written to all the memory cells (Writing 1), then the written data in all the memory cells is read out (Reading 1), then data "1" is written to the memory cells in the first row and the first column and in the second row and the second column while data "0" is written to the memory cells in the first row and the second column and in the second row and the first column (Writing 2), and then the written data in all the memory cells is read out (Reading 2).

In Writing 1, the CEB has a low potential only when the A has a high potential. The WREN has a high potential to connect the BL_OS to the BL and the SL, thereby allowing writing into the memory cell. The second driver circuit 192 outputs a row selection signal corresponding to the potential of the A, to the RWL and the WWL. Here, when the A has a low potential, a signal which selects the first row is output whereas when the A has a high potential, a signal which selects the second row is output. The RWL and the WWL of the selected row have a high potential.

In Writing 1, to write data "1" to all the memory cells, the BL_OS_1 and the BL_OS_2 have a high potential in accordance with the timing of the row selection. Note that the signal input periods of the BL_OS_1 and the BL_OS_2 are set to be longer than the signal input period of the RWL and the WWL. This is because writing failure (here, writing of data "0") to the memory cell would occur if the signal input periods of the BL_OS_1 and the BL_OS_2 were shorter. Note that the potentials of the BL_OUT_1 and the BL_OUT_2 do not matter (may be high or may be low) in writing.

In Reading 1, the CEB has a low potential only when the A has a high potential. The WREN has a low potential to connect the RS and the BL, and the SL2 and the SL, thereby allowing reading out of the memory cell. The second driver circuit 192 outputs a row selection signal corresponding to the potential of the A, to the RWL and the WWL. Here, when the A has a low potential, a signal which selects the first row is output whereas when the A has a high potential, a signal which selects the second row is output. The RWL of the selected row has a high potential. The WWL has a low potential regardless whether the row is selected or not.

Through the above operation, the potential corresponding to the data held in the memory cells in the selected rows is applied to the BL_OUT_1 and the BL_OUT_2. Note that the potentials of the BL_OS_1 and the BL_OS_2 do not matter in reading.

The relation among the potentials of the lines in Writing 2 is similar to that in Writing 1. Note that the BL_OS_1 and the BL_OS_2 have a high potential or a low potential in accordance with the timing of the row selection in order to write data "1" into the memory cells in the first row and the first column and in the second row and the second column and in order to write data "0" into the memory cells in the first row and the second column and in the second row and the first column.

The relation among the potentials of the lines in Reading 2 is similar to that in Reading 1. It is confirmed that the potential corresponding to the data held in the memory cells in the selected rows is applied to the BL_OUT_1 and the BL_OUT_2.

Note that in a holding period, the CEB has a high potential and is disabled. Since reading or writing is not performed in the holding period, the other signals do not matter.

The structures, methods, and the like described in this embodiment can be combined as appropriate with any of the structures and methods described in the other embodiments.

(Embodiment 3)

In this embodiment, a structure and a manufacturing method of a semiconductor device according to an embodiment of the disclosed invention will be described with reference to FIGS. 5A and 5B, FIGS. 6A to 6D, FIGS. 7A to 7D, FIGS. 8 to 8D, and FIGS. 9A to 9C.

<Cross-Sectional Structure and Planar Structure of Semiconductor Device>

Figure 5A:
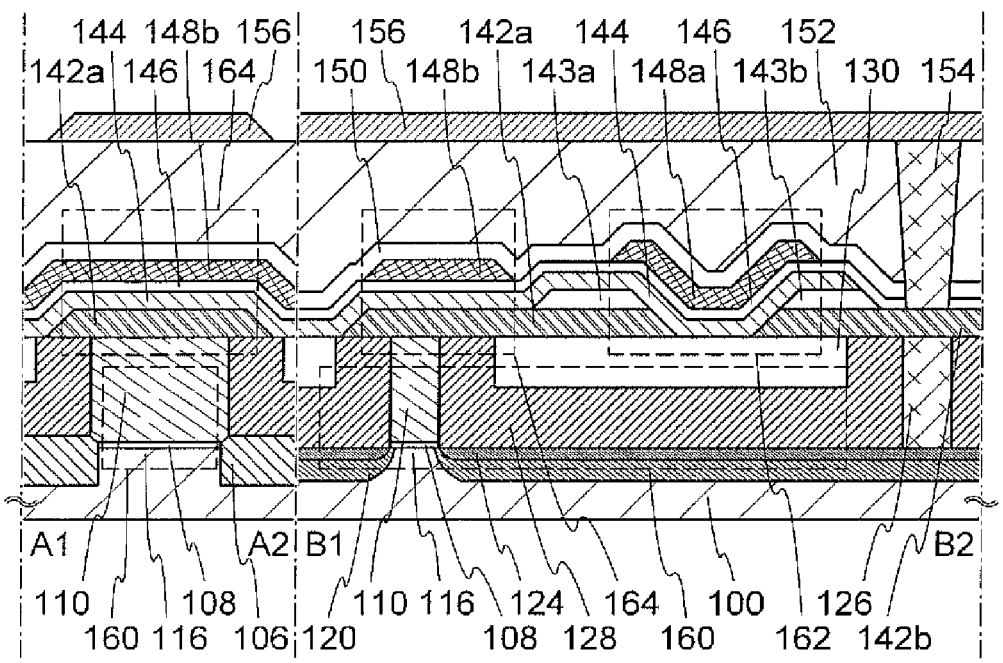
FIGS. 5A and 5B are a cross-sectional view and a plan view of a semiconductor device.
Figure 5B:
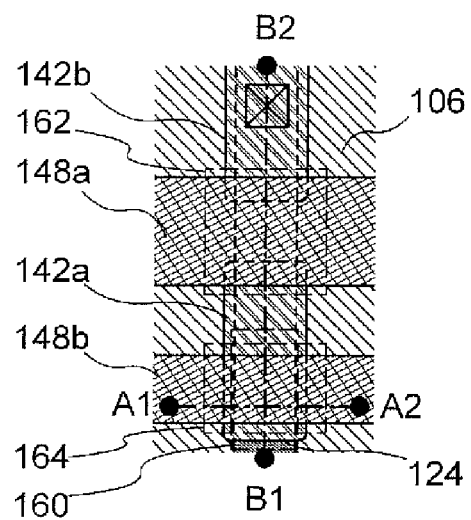

FIGS. 5A and 5B illustrate an example of a structure of a semiconductor device. FIG. 5A illustrates a cross section of the semiconductor device, and FIG. 5B illustrates a plan view of the semiconductor device. Here, FIG. 5A illustrates a cross section taken along line A1-A2 and line B1-B2 in FIG. 5B. The semiconductor device illustrated in FIGS. 5A and 5B includes the transistor 160 including a first semiconductor material in a lower portion, and the transistor 162 including a second semiconductor material in an upper portion. Here, the first semiconductor material and the second semiconductor material are preferably different from each other. For example, the first semiconductor material may be a semiconductor material which is not all oxide semiconductor and the second semiconductor material may be an oxide semiconductor. The semiconductor material which is not an oxide semiconductor may be, for example, silicon, germanium, silicon germanium, silicon carbide, gallium arsenide, or the like, and a single crystal semiconductor is preferably used. Further, an organic semiconductor material may be used. A transistor including such a semiconductor material can easily operate at high speed. On the other hand, a transistor including an oxide semiconductor can hold charge for a long time because of its characteristics.

Although both of the transistors are n-channel transistors in this description, it should be appreciated that p-channel transistors can be used. Since the technical feature of the disclosed invention lies in the use of a semiconductor material like an oxide semiconductor, which can sufficiently reduce off-state current, for the transistor 162 in order to hold data, it is not necessary to limit specific conditions such as a structure, material, or the like of the semiconductor device to those given here.

The transistor 160 in FIGS. 5A and 5B includes a channel formation region 116 provided in a substrate 100 including a semiconductor material (e.g., silicon), impurity regions 120 provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for the sake of convenience. Further, in such a case, in description of a connection of a transistor, a source region and a source electrode may be collectively referred to as a source electrode and a drain region and a drain electrode may be collectively referred to as a drain electrode. That is, in this specification, the term "source electrode" may include a source region and the term "drain electrode" may include a drain region.

An electrode 126 is connected to part of the metal compound region 124 of the transistor 160. Here, the electrode 126 serves as a source electrode or a drain electrode of the transistor 160. Further, the substrate 100 is provided with an element isolation insulating layer 106 which surrounds the transistor 160. An insulating layer 128 and an insulating layer 130 are provided over the transistor 160. Note that for high integration, it is preferable that, as in FIGS. 5A and 5B, the transistor 160 does not have a sidewall insulating layer. On the other hand, when the characteristics of the transistor 160 have priority, the sidewall insulating layer may be formed on a side surface of the gate electrode 110 and the impurity region 120 may include a region having a different impurity concentration in a region overlapping with the sidewall insulating layer.

The transistor 162 in FIGS. 5A and 5B includes a source or drain electrode 142a and a source or drain electrode 142b which are provided over the insulating layer 130; an oxide semiconductor layer 144 which is electrically connected to the source or drain electrode 142a and the source or drain electrode 142b; a gate insulating layer 146 which covers the source or drain electrode 142a, the source or drain electrode 142b, and the oxide semiconductor layer 144; a gate electrode 148a which is provided over the gate insulating layer 146 so as to overlap with the oxide semiconductor layer 144; an insulating layer 143a which overlaps with part of the gate electrode 148a and is in a region between the source or drain electrode 142a and the oxide semiconductor layer 144; and an insulating layer 143b which overlaps with part of the gate electrode 148a and is in a region between the source or drain electrode 142b and the oxide semiconductor layer 144. Note that the insulating layer 143a and the insulating layer 143b are preferably provided in order to reduce the capacitance between the source or drain electrode and the gate electrode, but they may be omitted.

Here, it is preferable that the oxide semiconductor layer 144 be highly purified by sufficient removal of impurities such as hydrogen and/or sufficient supply of oxygen. Specifically, the concentration of hydrogen in the oxide semiconductor layer 144 is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$, for example. Note that the concentration of hydrogen in the oxide semiconductor layer 144 is measured by secondary ion mass spectrometry (SIMS). Thus, in the oxide semiconductor layer 144 in which the hydrogen concentration is sufficiently reduced so that the oxide semiconductor layer is highly purified and in which defect states in the energy gap due to oxygen deficiency are reduced by sufficient supply of oxygen, the carrier concentration can be easily reduced. For example, the carrier concentration is lower than $1 \times 10^{13}$ /cm$^3$, preferably lower than $1 \times 10^{11}$ /cm$^3$, more preferably lower than $1.45 \times 10^{10}$ /cm$^3$. In addition, the off-state current of the transistor can be easily reduced. For example, the off-state current (here, current per micrometer (μm) of channel width) at room temperature (25° C.) is 100 zA (1 zA (zeptoampere) is $1 \times 0^{-21}$ A) or less, preferably 10 zA or less. With the use of such an i-type (intrinsic) or substantially i-type oxide semiconductor, the transistor 162 which has significantly excellent off-state current characteristics can be easily obtained.

Note that although the transistor 162 in FIGS. 5A and 5B includes the oxide semiconductor layer 144 which is processed into an island shape in order to suppress leakage current between elements which is caused due to miniaturization, the oxide semiconductor layer 144 which is not processed into an island shape may be employed. In the case where the oxide semiconductor layer is not processed into an island shape, contamination of the oxide semiconductor layer 144 due to etching in the process can be prevented.

The capacitor 164 in FIGS. 5A and 5B includes the source or drain electrode 142a, the oxide semiconductor layer 144, the gate insulating layer 146, and an electrode 148b. The source or drain electrode 142a serves as one electrode of the capacitor 164, and the electrode 148b serves as the other electrode of the capacitor 164.

Note that in the capacitor 164 in FIGS. 5A and 5B, the oxide semiconductor layer 144 and the gate insulating layer 146 are stacked, whereby insulation between the source or drain electrode 142a and the electrode 148b can be adequately ensured. Needless to say, in order to provide sufficient capacitance, the oxide semiconductor layer 144 in the capacitor 164 may be omitted. Alternatively, an insulating layer formed at the same time as the insulating layer 143a may be included in the capacitor 164. Further alternatively, the capacitor 164 may be omitted if not necessary.

Note that in the transistor 162 and the capacitor 164, end portions of the source or drain electrode 142a and the source or drain electrode 142b are preferably tapered. When the end portions of the source or drain electrode 142a and the source or drain electrode 142b are tapered, the coverage with the oxide semiconductor layer 144 can be improved and a breaking thereof can be prevented. Here, the taper angle is 30° to 60° inclusive, for example. Note that the taper angle is a tilt angle formed between a side surface and a bottom surface of a layer having a tapered shape (e.g., the source or drain electrode 142a) when the layer is seen in a direction perpendicular to a cross-sectional plane (i.e., the plane perpendicular to the surface of a substrate).

In this embodiment, the transistor 162 and the capacitor 164 are provided so as to overlap with the transistor 160. By employing such a planar layout, high integration is possible. For example, when F is the the minimum feature size, the area occupied by a memory cell can be 15 F$^2$ to 25 F$^2$ inclusive.

An insulating layer 150 is provided over the transistor 162 and the capacitor 164, and an insulating layer 152 is provided over the insulating layer 150. In an opening formed in the gate insulating layer 146, the insulating layer 150, and the insulating layer 152, an electrode 154 is provided. Over the insulating layer 152, a wiring 156 connected to the electrode 154 is formed. Note that although the metal compound region 124, the source or drain electrode 142b, and the wiring 156 are connected to each other via the electrode 126 and the electrode 154 in FIGS. 5A and 5B, the disclosed invention is not limited thereto. For example, the source or drain electrode 142b may be in direct contact with the metal compound region 124, or the wiring 156 may be in direct contact with the source or drain electrode 142b.

Note that in FIGS. 5A and 5B, the electrode 126 connecting the metal compound region 124 and the source or drain electrode 142b and the electrode 154 connecting the source or drain electrode 142b and the wiring 156 overlap with each other. In other words, a region where the electrode 126 serving as a source or drain electrode of the transistor 160 and the source or drain electrode 142b of the transistor 162 are in contact with each other overlaps with a region where the source or drain electrode 142b of the transistor 162 and the wiring 156 connecting one memory cell to another memory cell are in contact with each other. With such a layout, the degree of integration can be increased.

<Method for Manufacturing Semiconductor Device>

Next, an example of a method for manufacturing the semiconductor device will be described. First, a method for manufacturing the transistor 160 in the lower portion will be described below with reference to FIGS. 6A to 6D and 7A to 7D, and then a method for manufacturing the transistor 162 and the capacitor in the upper portion will be described with reference to FIGS. 8A to 8D and FIGS. 9A to 9C.

<Method for Manufacturing Transistor in Lower Portion>

Figure 6A:
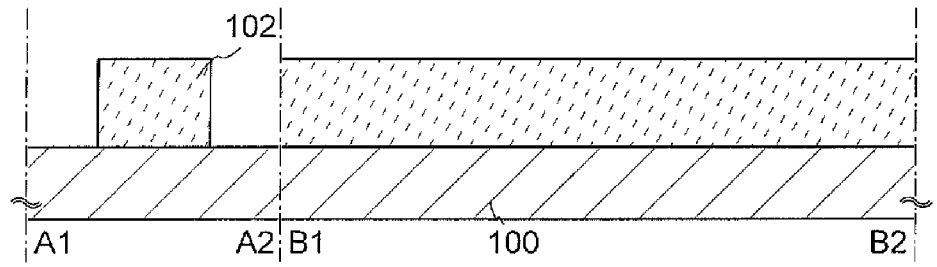
FIGS. 6A to 6D are cross-sectional views of manufacturing steps of a semiconductor device.
Figure 6B:
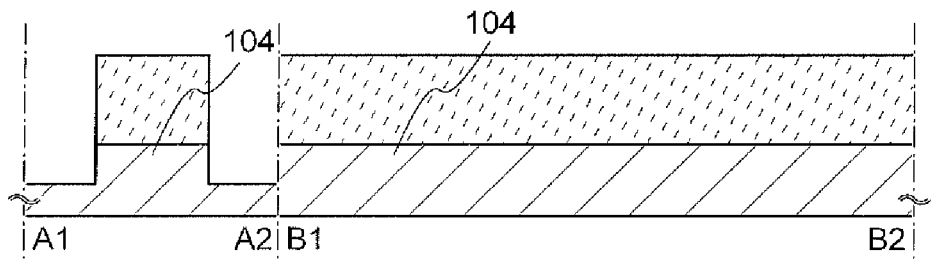

First, the substrate 100 including a semiconductor material is prepared (see FIG. 6A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example where a single crystal silicon substrate is used as the substrate 100 including a semiconductor material is described. Note that although the term "SOI substrate" generally means a substrate in which a silicon semiconductor layer is provided on an insulating surface, the term "SOI substrate" in this specification and the like also includes a substrate in which a semiconductor layer including a material which is not silicon is provided on an insulating surface. That is, the semiconductor layer included in the "SOI substrate" is not limited to a silicon semiconductor layer. Moreover, the SOI substrate also includes a substrate having a structure in which a semiconductor layer is provided over an insulating substrate such as a glass substrate with an insulating layer interposed therebetween.

As the substrate 100 including a semiconductor material, a single crystal semiconductor substrate of silicon or the like is particularly preferable because high-speed reading operation of the semiconductor device can be realized.

A protective layer 102 serving as a mask for forming an element isolation insulating layer is formed over the substrate 100 (see FIG. 6A). As the protective layer 102, an insulating layer formed using a material such as silicon oxide, silicon nitride, or silicon oxynitride can be used, for example. Note that before or after this step, an impurity element imparting n-type conductivity or p-type conductivity may be added to the substrate 100 in order to control the threshold voltage of the transistor. When the semiconductor material in the substrate 100 is silicon, phosphorus, arsenic, or the like can be used as the impurity imparting n-type conductivity, and boron, aluminum, gallium, or the like can be used as the impurity imparting p-type conductivity.

Then, part of the substrate 100 in a region that is not covered with the protective layer 102 (in an exposed region) is removed by etching using the protective layer 102 as a mask. Thus, a semiconductor region 104 isolated from the other semiconductor regions is formed (see FIG. 6B). As the etching, dry etching is preferably performed, but wet etching may be performed. An etching gas and an etchant can be selected as appropriate in accordance with a material to be etched.

Figure 6C:
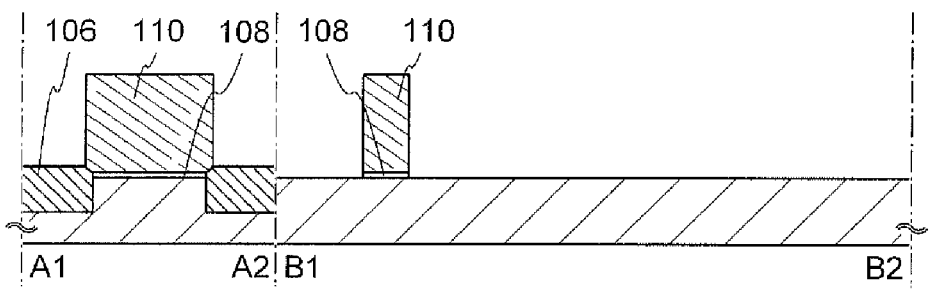

Then, an insulating layer is formed so as to cover the semiconductor region 104, and the insulating layer in a region overlapping with the semiconductor region 104 is selectively removed, whereby the element isolation insulating layer 106 is formed (see FIG. 6C). The insulating layer is formed using silicon oxide, silicon nitride, silicon oxynitride, or the like. For removing the insulating layer, any of etching treatment, polishing treatment such as CMP (chemical mechanical polishing), and the like can be employed. Note that the protective layer 102 is removed after the formation of the semiconductor region 104 or after the formation of the element isolation insulating layer 106.

Note that the element isolation insulating layer 106 may be formed by, instead of selectively removing an insulating layer, implanting oxygen to form an insulating region, for example.

Then, an insulating layer is formed on a surface of the semiconductor region IS 104, and a layer including a conductive material is formed over the insulating layer.

The insulating layer is to be a gate insulating layer later, and can be formed by heat treatment (thermal oxidation treatment, thermal nitridation treatment, or the like) on the surface of the semiconductor region 104, for example. High-density plasma treatment may be employed in stead of heat treatment. The high-density plasma treatment can be performed using, for example, a mixed gas of a rare gas such as He, Ar, Kr, or Xe, oxygen, nitrogen oxide, ammonia, nitrogen, or hydrogen. Needless to say, the insulating layer may be formed by a CVD method, a sputtering method, or the like. The insulating layer preferably has a single-layer structure or stacked structure including silicon oxide, silicon oxynitride, silicon nitride, hafnium oxide, aluminum oxide, tantalum oxide, yttrium oxide, hafnium silicate ($HfSi_xO_y$ ($x>0$, $y>0$)), hafnium silicate ($HfSi_xO_y$ ($x>0$, $y>0$)) to which nitrogen is added, hafnium aluminate ($HfAl_xO_y$ ($x>0$, $y>0$)) to which nitrogen is added, and the like. The insulating layer can have a thickness of, for example, 1 nm to 100 nm inclusive, preferably 10 nm to 50 nm inclusive.

The layer including a conductive material can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed. Note that in this embodiment, an example where the layer including a conductive material is formed using a metal material is described.

After that, the insulating layer and the layer including a conductive material are selectively etched, whereby the gate insulating layer 108 and the gate electrode 110 are formed (see FIG. 6C).

Figure 6D:
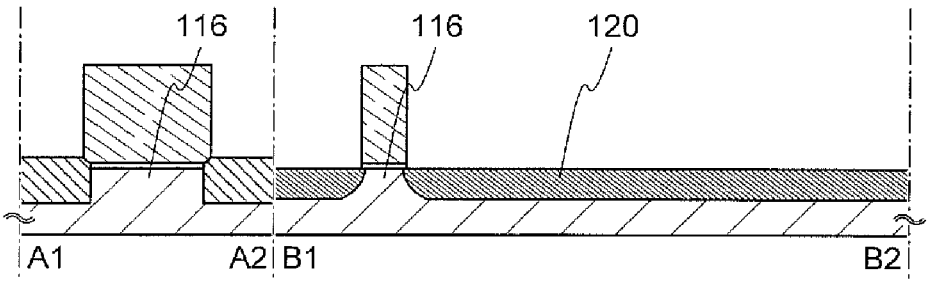

Then, phosphorus (P), arsenic (As), or the like is added to the semiconductor region 104, whereby the channel formation region 116 and the impurity region 120 are formed (see FIG. 6D). Note that phosphorus or arsenic is added here in order to form an n-channel transistor; an impurity element such as boron (B) or aluminum (Al) may be added when a p-channel transistor is formed. Here, the concentration of the impurity which is added can be set as appropriate; the concentration is preferably increased when the semiconductor element is highly miniaturized.

Note that a sidewall insulating layer may be formed around the gate electrode 110 and an impurity region to which an impurity element is added at a different concentration may be formed.

Figure 7A:
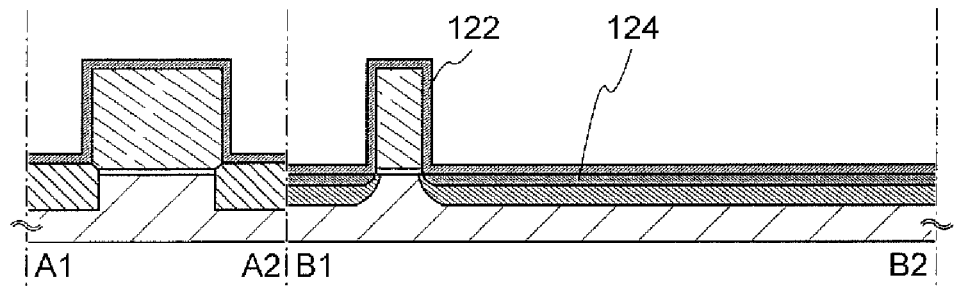
FIGS. 7A to 7D are cross-sectional views of manufacturing steps of a semiconductor device.

Then, a metal layer 122 is formed so as to cover the gate electrode 110, the impurity region 120, and the like (see FIG. 7A). Any of a variety of film formation methods such as a vacuum evaporation method, a sputtering method, and a spin coating method can be employed for forming the metal layer 122. It is preferable that the metal layer 122 be formed using a metal material that reacts with a semiconductor material included in the semiconductor region 104 to form a low-resistance metal compound. Examples of such a metal material include titanium, tantalum, tungsten, nickel, cobalt, and platinum.

Then, heat treatment is performed so that the metal layer 122 may react with the semiconductor material. Thus, the metal compound region 124 which is in contact with the impurity region 120 is formed (see FIG. 7A). Note that when the gate electrode 110 is formed using polycrystalline silicon or the like, a metal compound region is also formed in a region of the gate electrode 110 which is in contact with the metal layer 122.

As the heat treatment, irradiation with a flash lamp can be employed, for example. Although it should be appreciated that another heat treatment method may be used, a method by which the heat treatment can be achieved in an extremely short time is preferably used in order to improve the controllability of chemical reaction for formation of the metal compound. Note that the metal compound region is formed by the reaction of the metal material and the semiconductor material and has sufficiently high conductivity. The formation of the metal compound region can sufficiently reduce electric resistance and improve element characteristics. Note that the metal layer 122 is removed after the metal compound region 124 is formed.

Figure 7B:
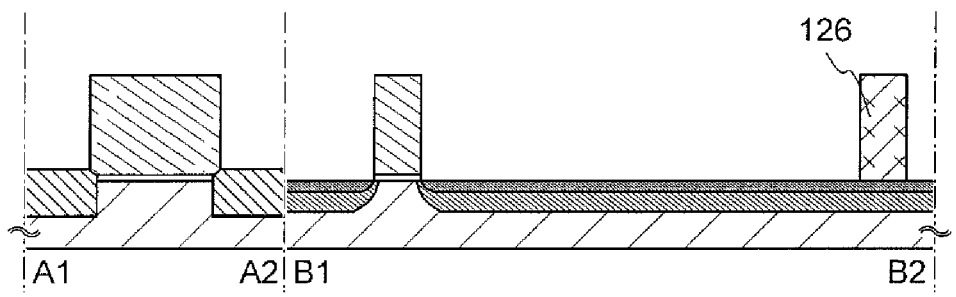

Then, the electrode 126 is formed in a region in contact with part of the metal compound region 124 (see FIG. 7B). The electrode 126 is formed by, for example, forming a layer including a conductive material and then selectively etching the layer. The layer including a conductive material can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed.

Alternatively, the electrode 126 can be formed by forming an opening reaching the metal compound region 124 in the insulating layer 128 and the insulating layer 130 after the formation of the insulating layer 128 and the insulating layer 130, and then by filling the opening.

In such a case, for example, it is possible to employ a method in which a thin titanium film is formed by a PVD method and a thin titanium nitride film is formed by a CVD method in a region including the opening, and then a tungsten film is formed so as to fill the opening. Here, the titanium film formed by a PVD method has a function of reducing an oxide film (such as a native oxide film) over which the titanium film is to be formed, and thereby lowering contact resistance with lower electrodes or the like (the metal compound regions 124, here). The titanium nitride film formed after the formation of the titanium film has a barrier function of suppressing diffusion of the conductive material. A copper film may be formed by a plating method after the formation of the barrier film of titanium, titanium nitride, or the like.

Figure 7C:
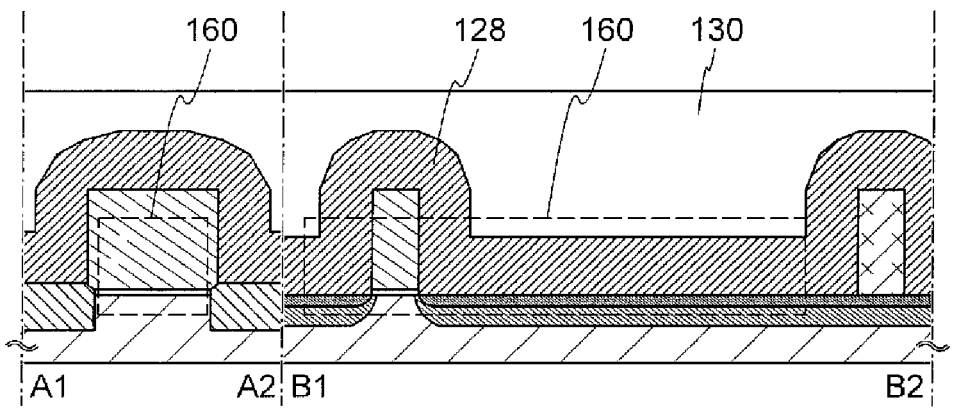

Then, the insulating layer 128 and the insulating layer 130 are formed so as to cover the components formed in the above steps (see FIG. 7C). The insulating layers 128 and 130 can be formed using a material including an inorganic insulating material such as silicon oxide, silicon oxynitride, silicon nitride, or aluminum oxide. In particular, a material with a low dielectric constant (a low-k material) is preferably used for the insulating layer 128 and the insulating layer 130, because capacitance due to overlap of electrodes and/or wirings can be sufficiently reduced. Note that the insulating layer 128 and the insulating layer 130 may be a porous insulating layer formed using any of those materials. A porous insulating layer has a lower dielectric constant than an insulating layer with high density, and thus allows a further reduction in capacitance generated by electrodes and/or wirings. Further, the insulating layer 128 and the insulating layer 130 can be formed using an organic insulating material such as polyimide or acrylic. Note that although a stacked structure of the insulating layer 128 and the insulating layer 130 is employed here, one embodiment of the disclosed invention is not limited to this. A single-layer structure or a stacked structure including three or more layers can be used.

Through the above steps, the transistor 160 is formed with the use of the substrate 100 including a semiconductor material (see FIG. 7C). The transistor 160 can operate at high speed. By using this transistor as a read transistor, data can be read out at high speed.

Figure 7D:
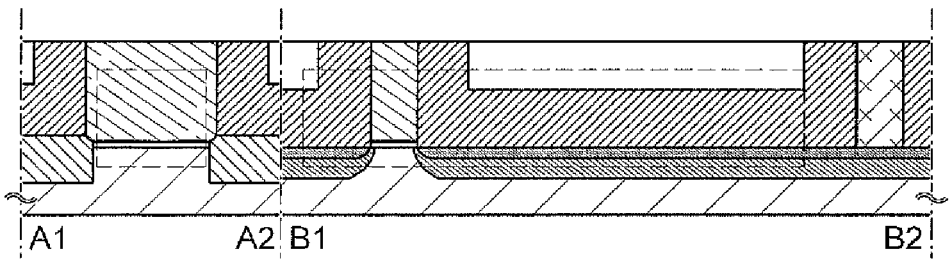

Then, as a pretreatment for the formation of the transistor 162 and the capacitor 164, CMP treatment is performed on the insulating layer 128 and the insulating layer 130 to expose the upper surfaces of the gate electrode 110 and the electrode 126 (see FIG. 7D). As the treatment for exposing the upper surfaces of the gate electrode 110 and the electrode 126, etching treatment may be employed as an alternative to (or in combination with) CMP treatment. Note that it is preferable to planarize the surface of the insulating layer 128 and the insulating layer 130 as much as possible in order to improve the characteristics of the transistor 162.

Note that a step of forming an electrode, a wiring, a semiconductor layer, an insulating layer, or the like may be further included before and after each of the above steps. For example, the wiring may have a multi-layer structure including a stacked structure of an insulating layer and a conductive layer to provide a highly integrated semiconductor device.

<Method for Manufacturing Transistor in Upper Portion>

Figure 8A:
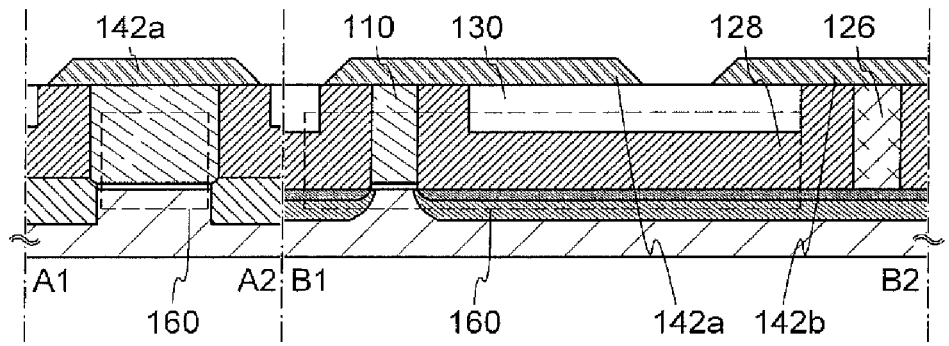
FIGS. 8A to 8D are cross-sectional views of manufacturing steps of a semiconductor device.

Then, a conductive layer is formed over the gate electrode 110, the electrode 126, the insulating layer 128, the insulating layer 130, and the like and is selectively etched, whereby the source or drain electrode 142a and the source or drain electrode 142b are formed (see FIG. 8A).

The conductive layer can be formed by a PVD method typified by a sputtering method or a CVD method such as a plasma CVD method. As a material for the conductive layer, an element selected from aluminum, chromium, copper, tantalum, titanium, molybdenum, and tungsten; an alloy including any of these elements as a component; or the like can be used. Any of manganese, magnesium, zirconium, beryllium, neodymium, scandium, or a material including any of these in combination may be used.

The conductive layer may have a single-layer structure or a stacked structure including two or more layers. For example, a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked, and the like can be given. Note that in the case where the conductive layer has a single-layer structure of a titanium film or a titanium nitride film, there is an advantage that the conductive layer is easily processed into the source or drain electrode 142a and the source or drain electrode 142b having tapered shapes.

Alternatively, the conductive layer may be formed using a conductive metal oxide. The conductive metal oxide can be indium oxide ($In_2O_3$), tin oxide ($SnO_2$), zinc oxide (ZnO), an indium oxide-tin oxide alloy ($In_2O_3$—$SnO_2$, which may be abbreviated to ITO), an indium oxide-zinc oxide alloy ($In_2O_3$—ZnO), or any of these metal oxide materials including silicon or silicon oxide.

The conductive layer is preferably etched so that end portions of the source or drain electrode 142a and the source or drain electrode 142b may be tapered. Here, the taper angle is preferably 30° to 60° inclusive, for example. When the source or drain electrode 142a and the source or drain electrode 142b are etched to have tapered end portions, the coverage with the gate insulating layer 146 formed later can be improved and breaking thereof can be prevented.

The channel length (L) of the transistor in the upper portion is determined by the distance between a lower end portion of the source or drain electrode 142a and a lower end portion of the source or drain electrode 142b. Note that in light exposure for forming a mask for a transistor with a channel length (L) of less than 25 nm, it is preferable to use extreme ultraviolet rays whose wavelength is as short as several nanometers to several tens of nanometers. The resolution of light exposure with extreme ultraviolet rays is high and the depth of focus is large. Accordingly, the channel length (L) of the transistor formed later can be 10 nm to 1000 nm (1 μm) inclusive, whereby an operation speed of a circuit can be increased. Moreover, power consumption of the semiconductor device can be reduced by miniaturization.

Note that an insulating layer serving as a base may be provided over the insulating layer 128 and the insulating layer 130. The insulating layer can be formed by a PVD method, a CVD method, or the like.

Figure 8B:
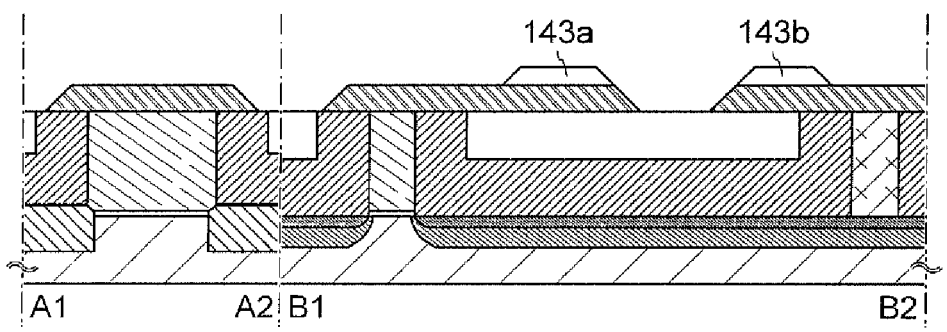

Then, the insulating layer 143a and the insulating layer 143b are formed over the source or drain electrode 142a and the source or drain electrode 142b, respectively (see FIG. 8B). The insulating, layer 143a and the insulating layer 143b can be formed by forming an insulating layer so as to cover the source or drain electrode 142a and the source or drain electrode 142b and then selectively etching the insulating layer. The insulating layer 143a and the insulating layer 143b are formed to overlap with part of a gate electrode formed later. By forming those insulating layers, the capacitance between the gate electrode and the source or drain electrode can be reduced.

The insulating layers 143a and 143b can be formed using a material including an inorganic insulating material such as silicon oxide, silicon oxynitride, silicon nitride, or aluminum oxide. In particular, a material with a low dielectric constant (a low-k material) is preferably used for the insulating layer 143a and the insulating layer 143b, because the capacitance between the gate electrode and the source or drain electrode can be sufficiently reduced. Note that the insulating layer 143a and the insulating layer 143b may be a porous insulating layer formed using any of those materials. A porous insulating layer has a lower dielectric constant than an insulating layer with high density, and thus allows a further reduction in capacitance between the gate electrode and the source or drain electrode.

Note that although the insulating layers 143a and 143b are preferably provided for reduction in capacitance between the gate electrode and the source or drain electrode, the insulating layers may be omitted.

Figure 8C:
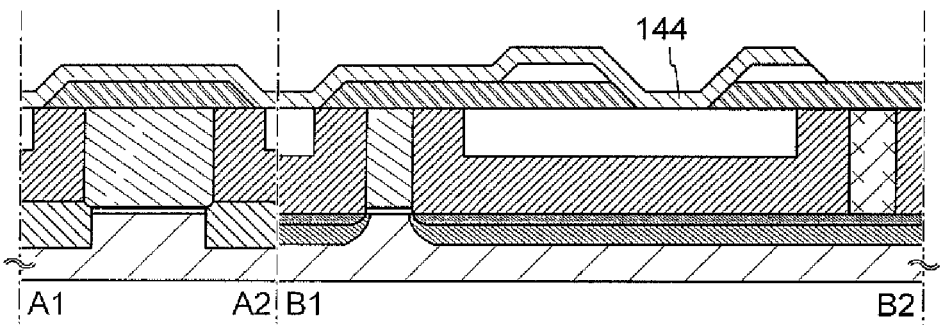
Figure 8D:
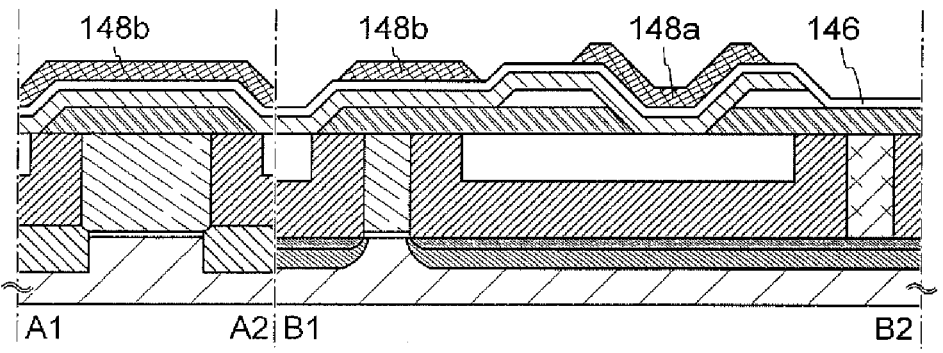

Then, after an oxide semiconductor layer is formed so as to cover the source or drain electrode 142a and the source or drain electrode 142b, the oxide semiconductor layer is selectively etched, whereby the oxide semiconductor layer 144 is formed (see FIG. 8C).

The oxide semiconductor layer can be formed using an In—Sn—Ga—Zn—O-based oxide semiconductor which is four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxide; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxide; an In—O-based oxide semiconductor, a Sn—O-based oxide semiconductor, a Zn—O-based oxide semiconductor; or the like.

In particular, an In—Ga—Zn—O-based oxide semiconductor material has sufficiently high resistance without an electric field and thus the off-state current can be sufficiently reduced. In addition, the In—Ga—Zn—O-based oxide semiconductor material has high field-effect mobility and thus is suitable as a semiconductor material used for a semiconductor device.

As a typical example of the In—Ga—Zn—O-based oxide semiconductor material, the one represented by InGaO$_3$(ZnO)$_m$ (m>0) is given. In addition, an oxide semiconductor material in which Ga is replaced by Al and which is represented by InMO$_3$(ZnO)$_m$ (m>0) can also be given. Here, M denotes one or more metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. Note that the above compositions are merely examples given in accordance with a crystal structure.

As a target used for forming the oxide semiconductor layer by a sputtering method, a target having a composition ratio expressed by the equation In:Ga:Zn=1:x:y (x is 0 or more, and y is 0.5 to 5 inclusive) is preferable. For example, a target having a composition ratio expressed by the equation In$_2$O$_3$:Ga$_2$O$_3$:ZnO=1:1:2 [molar ratio], or the like can be used. Alternatively, a target having a composition ratio expressed by the equation In$_2$O$_3$:Ga$_2$O$_3$:ZnO=1:1:1 [molar ratio], a target having a composition ratio expressed by the equation In$_2$O$_3$:Ga$_2$O$_3$:ZnO=1:1:4 [molar ratio], or a target having a composition ratio expressed by the equation In$_2$O$_3$:ZnO=1:2 [molar ratio] can be used.

In this embodiment, an oxide semiconductor layer having an amorphous structure is formed by a sputtering method using an In—Ga—Zn—O-based metal oxide target.

The relative density of the metal oxide in the metal oxide target is 80% or higher, preferably 95% or higher, more preferably 99.9% or higher. With the use of the metal oxide target with high relative density, the oxide semiconductor layer can be formed to have a dense structure.

The atmosphere in which the oxide semiconductor layer is formed is preferably a rare gas (typically argon) atmosphere, an oxygen atmosphere, or a mixed atmosphere including a rare gas (typically argon) and oxygen. Specifically, for example, an atmosphere of a high-purity gas is preferable from which impurities such as hydrogen, water, hydroxyl, or hydride are removed so that the concentration thereof is reduced to 1 ppm or less (preferably to 10 ppb or less).

In the formation of the oxide semiconductor layer, for example, an object to be processed is held in a process chamber that is kept under reduced pressure and the object is heated so that the temperature of the object becomes higher than or equal to 100° C. and lower than 550° C., preferably 200° C. to 400° C. inclusive. Alternatively, the temperature of the object in the formation of the oxide semiconductor layer may be room temperature (15° C. to 35° C. inclusive). Moisture in the process chamber is removed, a sputtering gas from which hydrogen, water, and the like are removed is introduced, and the above target is used, and thus the oxide semiconductor layer is formed. By forming the oxide semiconductor layer while heating the object, impurities in the oxide semiconductor layer can be reduced. In addition, damage by sputtering can be reduced. In order to remove moisture in the process chamber, an entrapment vacuum pump is preferably used. For example, a cryopump, an ion pump, a titanium sublimation pump, or the like can be used. Further, a turbo pump provided with a cold trap may be used. By evacuation with the cryopump or the like, hydrogen, water, and the like can be removed from the process chamber, whereby the impurity concentration of the oxide semiconductor layer can be reduced.

The oxide semiconductor layer can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferable because powdery substances (also referred to as particles or dust) formed at the time of film formation can be reduced and the film thickness can be uniform. The thickness of the oxide semiconductor layer is 1 nm to 50 nm inclusive, preferably 1 nm to 30 nm inclusive, more preferably 1 nm to 10 nm inclusive. With the oxide semiconductor layer having such a thickness, a short-channel effect which occurs along with miniaturization can be suppressed. Note that the appropriate thickness differs depending on the oxide semiconductor material to be used, the intended use of the semiconductor device, or the like; therefore, the thickness can also be determined in accordance with the material, the intended use, or the like.

Note that before the oxide semiconductor layer is formed by a sputtering method, a substance attached to a surface where the oxide semiconductor layer is to be formed (e.g., a surface of the insulating layer 130) is preferably removed by reverse sputtering in which an argon gas is introduced to generate plasma. Here, the reverse sputtering refers to a method in which ions collide with a surface of the substrate to be processed in order to modify the surface, in contrast to normal sputtering in which ions collide with a sputtering target. As a method for making ions collide with a surface to be processed, a method is given for example where high-frequency voltage is applied to the surface to be processed in an argon atmosphere and plasma is generated in the vicinity of the object to be processed. Note that the atmosphere may be nitrogen, helium, oxygen, or the like instead of an argon atmosphere.

After that, heat treatment (first heat treatment) is preferably performed on the oxide semiconductor layer. By the first heat treatment, excessive hydrogen (including water and hydroxyl) in the oxide semiconductor layer can be removed, the structure of the oxide semiconductor layer can be improved, and defect states in the energy gap can be reduced. The temperature of the first heat treatment is, for example, higher than or equal to 300° C. and lower than 550° C., or 400° C. to 500° C. inclusive.

The heat treatment can be performed in such a manner that, for example, the object to be processed is introduced into an electric furnace provided with a resistance heating element or the like and heated at 450° C. for one hour in a nitrogen atmosphere. During the heat treatment, the oxide semiconductor layer is not exposed to air to prevent entry of water and hydrogen.

The heat treatment apparatus is not limited to the electric furnace and may be an apparatus for heating an object by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

For example, as the first heat treatment, GRTA treatment may be performed in which the object is put in a heated inert gas atmosphere and heated for several minutes, and then taken out of the inert gas atmosphere. GRTA treatment enables high-temperature heat treatment for a short time. Moreover, GRTA treatment enables treatment at a temperature which exceeds the upper temperature limit. Note that the inert gas may be changed to a gas including oxygen during the treatment. This is because defect states in the energy gap due to oxygen vacancies can be reduced by performing the first heat treatment in an atmosphere including oxygen.

Note that as the inert gas atmosphere, an atmosphere that includes nitrogen or a rare gas (such as helium, neon, or argon) as a main component and does not include water, hydrogen, or the like is preferably used. For example, the purity of nitrogen or a rare gas such as helium, neon, or argon introduced into the heat treatment apparatus is higher than or equal to 6N (99.9999%), preferably higher than or equal to 7N (99.99999%) (that is, the concentration of an impurity is lower than or equal to 1 ppm, preferably lower than or equal to 0.1 ppm).

In any case, impurities are reduced by the first heat treatment so that the i-type (intrinsic) or substantially i-type oxide semiconductor layer is obtained. Accordingly, a transistor having significantly excellent characteristics can be realized.

The above heat treatment (first heat treatment) has an effect of removing hydrogen, water, and the like and thus can be referred to as dehydration treatment, dehydrogenation treatment, or the like. The dehydration treatment or the dehydrogenation treatment can also be performed at the following timing: after the formation of the oxide semiconductor layer, after the formation of the gate insulating layer, after the formation of the gate electrode, or the like. Such dehydration treatment or dehydrogenation treatment may be performed once or more times.

The etching of the oxide semiconductor layer may be performed before or after the heat treatment. In addition, although dry etching is favorable in terms of miniaturization of elements, wet etching may be used. An etching gas and an etchant can be selected as appropriate in accordance with a material to be etched. Note that in the case where a problem of leakage current and the like between elements does not occur, the oxide semiconductor layer may be used without being etched into an island shape.

Then, the gate insulating layer 146 is formed in contact with the oxide semiconductor layer 144. After that, over the gate insulating layer 146, the gate electrode 148a is formed in a region overlapping with the oxide semiconductor layer 144 and the electrode 148b is formed in a region overlapping with the source or drain electrode 142a (see FIG. 8D).

The gate insulating layer 146 can be formed by a CVD method, a sputtering method, or the like. The gate insulating layer 146 preferably includes silicon oxide, silicon nitride, silicon oxynitride, aluminum oxide, tantalum oxide, hafnium oxide, yttrium oxide, hafnium silicate ($HfSi_xO_y$ ($x>0$, $y>0$)), hafnium silicate ($HfSi_xO_y$ ($x>0$, $y>0$)) to which nitrogen is added, hafnium aluminate ($HfAl_xO_y$ ($x>0$, $y>0$)) to which nitrogen is added, or the like. The gate insulating layer 146 may have a single-layer structure or a stacked structure. There is no particular limitation on the thickness of the gate insulating layer 146; in the case where the semiconductor device is miniaturized, the gate insulating layer 146 is preferably thin in order to ensure the operation of the transistor. For example, in the case of using silicon oxide, the thickness can be 1 nm to 100 nm inclusive, preferably 10 nm to and 50 nm inclusive.

When the gate insulating layer is thin as in the above description, a problem of gate leakage due to a tunneling effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ ($x>0$, $y>0$)), hafnium silicate ($HfSi_xO_y$($x>0$, $y>0$)) to which nitrogen is added, or hafnium aluminate ($HfAl_xO_y$ ($x>0$, $y>0$)) to which nitrogen is added. With the use of a high-k material for the gate insulating layer 146, the thickness of the gate insulating layer 146 can be increased to prevent gate leakage and at the same time electrical characteristics can be maintained. Note that a stacked structure of a film including a high-k material and a film including any of silicon oxide, silicon nitride, silicon oxynitride, silicon nitride oxide, aluminum oxide, and the like may be employed.

After the gate insulating layer 146 is formed, second heat treatment is preferably performed in an inert gas atmosphere or an oxygen atmosphere. The temperature of the heat treatment is 200° C. to 450° C. inclusive, preferably 250° C. to 350° C. inclusive. For example, the heat treatment may be performed at 250° C. for one hour in a nitrogen atmosphere. The second heat treatment can reduce variation in electric characteristics of the transistors. Moreover, in the case where the gate insulating layer 146 includes oxygen, oxygen can be supplied to the oxide semiconductor layer 144 to fill oxygen vacancies in the oxide semiconductor layer 144, whereby an i-type (intrinsic) or substantially i-type oxide semiconductor layer can be formed.

Note that the second heat treatment is performed after the gate insulating layer 146 is formed in this embodiment; however, the timing of the second heat treatment is not limited to this. For example, the second heat treatment may be performed after the gate electrode is formed. Alternatively, the first heat treatment and the second heat treatment may be successively performed, the first heat treatment may double as the second heat treatment, or the second heat treatment may double as the first heat treatment.

As described above, at least one of the first heat treatment and the second heat treatment is employed, whereby impurities which are not the main components of the oxide semiconductor are excluded as much as possible and the oxide semiconductor layer 144 can be highly purified.

The gate electrode 148a and the electrode 148b can be formed by forming a conductive layer over the gate insulating layer 146 and then selectively etching the conductive layer. The conductive layer to be processed into the gate electrode 148a and the electrode 148b can be formed by a PVD method typified by a sputtering method or a CVD method such as a plasma CVD method. The details are similar to those of the source or drain electrode 142a or the like; thus, description thereof can be referred to.

Figure 9A:
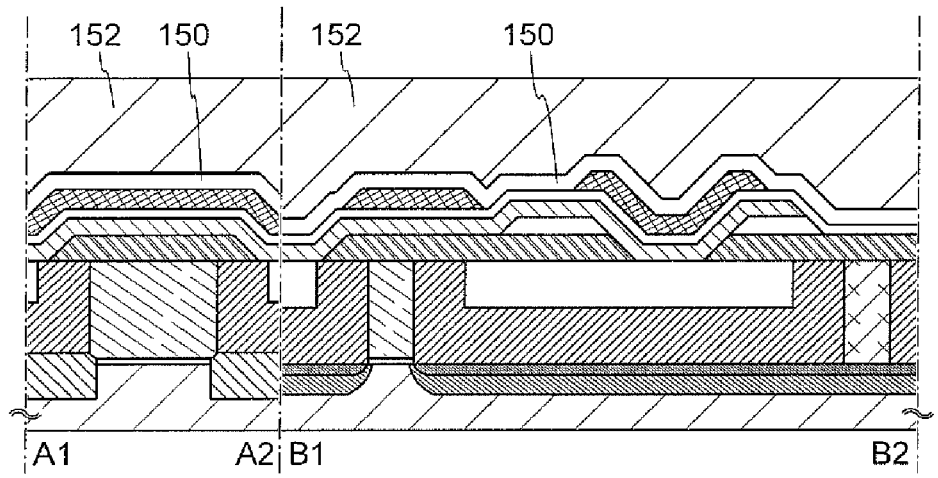
FIGS. 9A to 9C are cross-sectional views of manufacturing steps of a semiconductor device.

Then, the insulating layer 150 and the insulating layer 152 are formed over the gate insulating layer 146, the gate electrode 148a, and the electrode 148b (see FIG. 9A). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride, hafnium oxide, or aluminum oxide.

Note that for the insulating layer 150 and the insulating layer 152, a material with a low dielectric constant may be preferably used or a structure with a low dielectric constant (e.g., a porous structure) may be preferably employed. This is because by reducing the dielectric constant of the insulating layer 150 and the insulating layer 152, capacitance between wirings and electrodes can be reduced, which will increase operation speed.

Note that although a stacked structure of the insulating layer 150 and the insulating layer 152 is employed in this embodiment, one embodiment of the disclosed invention is not limited to this. A single-layer structure or a stacked structure including three or more layers can be used. Alternatively, the insulating layer may be omitted.

Note that the insulating layer 152 is preferably formed so as to have a planarized surface. By forming the insulating layer 152 having a planarized surface, an electrode, a wiring, or the like can be favorably formed over the insulating layer 152 even in the case where the semiconductor device is miniaturized, for example. The insulating layer 152 can be planarized by a method such as chemical mechanical polishing (CMP).

Figure 9B:
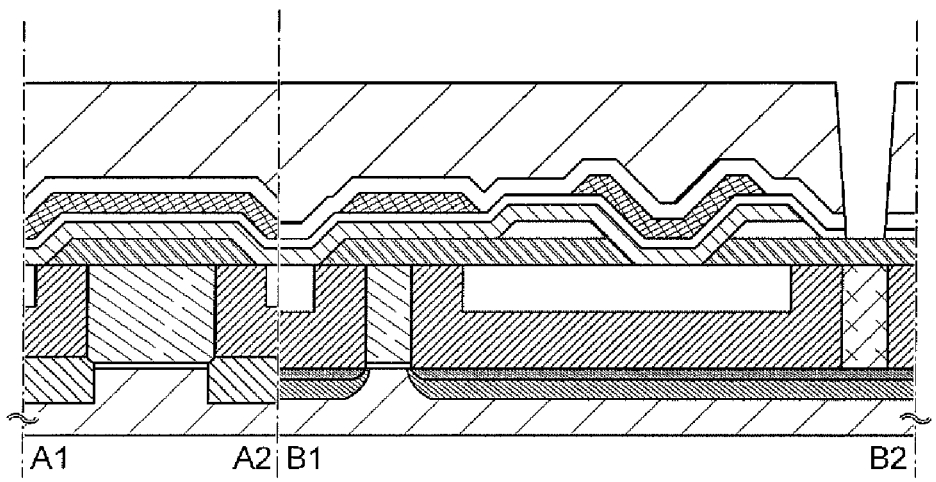

Then, an opening reaching the source or drain electrode 142b is formed in the gate insulating layer 146, the insulating layer 150, and the insulating layer 152 (see FIG. 9B). The opening is formed by selective etching using a mask or the like.

Here, the opening is preferably formed in a region overlapping with the electrode 126. By forming the opening in the region, the element area can be prevented from increasing due to a contact region of the electrodes. That is, the degree of integration of the semiconductor device can be increased.

Figure 9C:
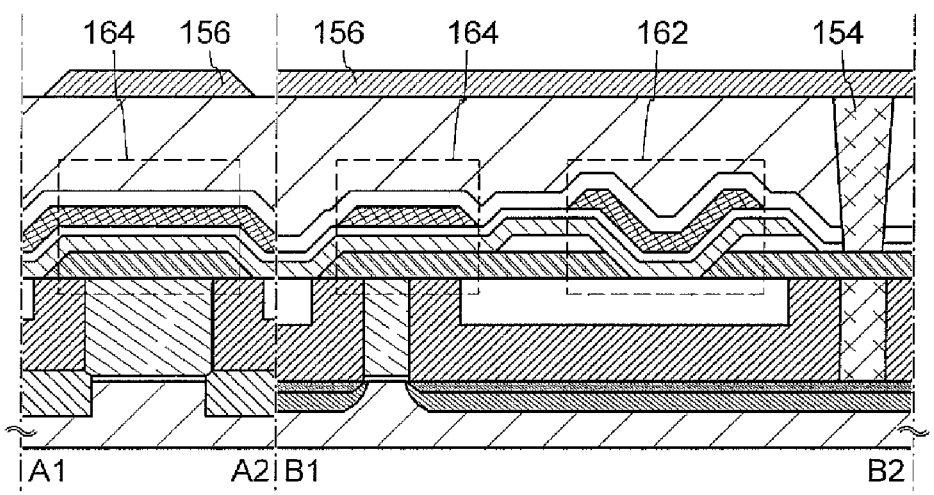

Then, the electrode 154 is formed in the opening and the wiring 156 in contact with the electrode 154 is formed over the insulating layer 152 (see FIG. 9C).

The electrode 154 can be formed in such a manner that, for example, a conductive layer is formed by a PVD method, a CVD method, or the like in a region including the opening and then part of the conductive layer is removed by etching treatment, CMP, or the like.

For a specific example, it is possible to employ a method in which a thin titanium film is formed by a PVD method in a region including the opening, a thin titanium nitride film is formed by a CVD method, and then a tungsten film is formed so as to fill the opening. Here, the titanium film formed by a PVD method has a function of reducing an oxide film (such as a native oxide film) over which the titanium film is to be formed, and thereby lowering contact resistance with lower electrodes or the like (the source or drain electrode 142b, here). The titanium nitride film formed after the formation of the titanium film has a barrier function of suppressing diffusion of the conductive material. A copper film may be formed by a plating method after the formation of the barrier film of titanium, titanium nitride, or the like.

Note that in the case where the electrode 154 is formed by removing part of the conductive layer, it is preferable that a surface of the electrode 154 be processed to be flat. For example, when a thin titanium film or a thin titanium nitride film is formed in a region including the opening and then a tungsten film is formed so as to fill the opening, an unnecessary portion of the tungsten film, titanium film, titanium nitride film, or the like can be removed and the planarity of the surface of the electrode 154 can be improved by subsequent CMP treatment. Further, such treatment for improving the planarity can planarize the entire surface including the surface of the electrode 154. By planarizing the entire surface including the surface of the electrode 154, an electrode, a wiring, an insulating layer, a semiconductor layer, and the like can be favorably formed in later steps.

The wiring 156 is formed by forming a conductive layer by a PVD method typified by a sputtering method or a CVD method such as a plasma CVD method and then patterning the conductive layer. As a material for the conductive layer, an element selected from aluminum, chromium, copper, tantalum, titanium, molybdenum, and tungsten; an alloy including any of these elements as a component; or the like can be used. Any of manganese, magnesium, zirconium, beryllium, neodymium, scandium, or a material including any of these in combination may be used. The details are similar to those of the source or drain electrode 142a or the like.

Through the above steps, the transistor 162 including the highly purified oxide semiconductor layer 144 and the capacitor 164 are completed (see FIG. 9C).

In the transistor 162 described in this embodiment, the oxide semiconductor layer 144 is highly purified and thus the hydrogen concentration thereof is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. The carrier density of the oxide semiconductor layer 144 is sufficiently low (e.g., lower than $1 \times 10^{12}$/cm$^3$, preferably lower than $1.45 \times 10^{10}$/cm$^3$) as compared to the carrier density of a general silicon wafer (approximately $1\times10^{14}$/cm$^3$). Accordingly, the off-state current is also sufficiently small. For example, the off-state current (here, current per micrometer (μm) of channel width) of the transistor 162 at room temperature (25° C.) is smaller than or equal to 100 zA(1 zA (zeptoampere) is $1\times10^{-21}$ A), preferably smaller than or equal to 10 zA.

With the use of the highly purified intrinsic oxide semiconductor layer 144, the off-state current of the transistor can be sufficiently reduced easily. Further, with the use of such a transistor, a semiconductor device capable of holding stored data for an extremely long time can be obtained.

Further, by forming the electrode 126 and the electrode 154 so as to overlap with each other, the element area can be prevented from increasing due to a contact region of the electrodes. Thus, higher integration can be realized. Further, in the semiconductor device in this embodiment, wirings can be shared to realize a semiconductor device having a sufficiently increased integration degree.

The structures, methods, and the like described in this embodiment can be combined as appropriate with any of the structures and methods described in the other embodiments.
(Embodiment 4)

In this embodiment, the case where the semiconductor device described in any of the above embodiments is applied to an electronic device will be described with reference to FIGS. 10A to 10F. In this embodiment, the case where the above semiconductor device is applied to an electronic device such as a computer, a mobile phone (also referred to as a mobile telephone or a mobile telephone device), a portable information terminal (including a portable game console, an audio player, and the like), a digital camera, a digital video camera, an electronic paper, or a television device (also referred to as a television or a television receiver) will be described.

Figure 10A:
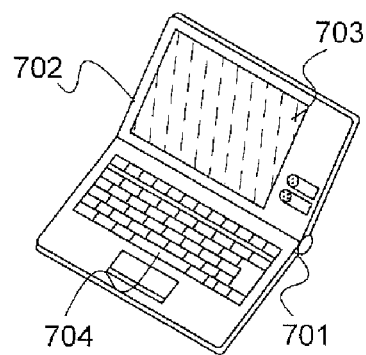
FIGS. 10A to 10F illustrate electronic devices including a semiconductor device.

FIG. 10A is a notebook personal computer including a housing 701, a housing 702, a display portion 703, a keyboard 704, and the like. The semiconductor device described in any of the above embodiments is provided in at least one of the housing 701 and the housing 702. Consequently, the notebook personal computer can perform writing and reading data at high speed and store data for a long time with sufficiently reduced power consumption.

Figure 10D:
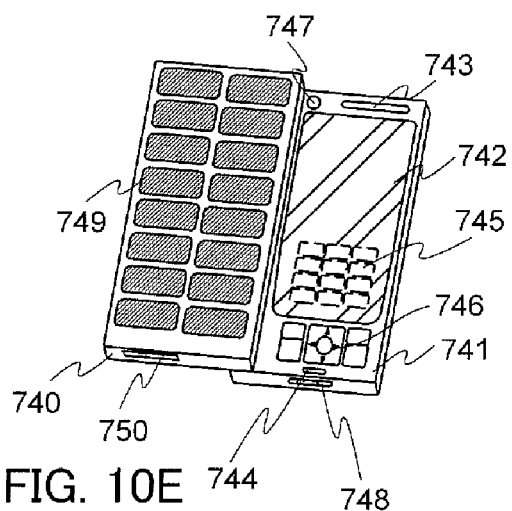
Figure 10B:
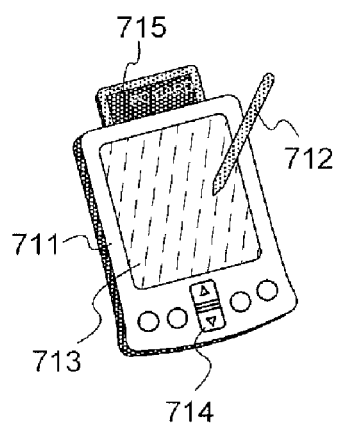

FIG. 10B is a portable information terminal (personal digital assistant (PDA)). A main body 711 is provided with a display portion 713, an external interface 715, operation buttons 714, and the like. Further, a stylus 712 for operating the portable information terminal or the like is also provided. The semiconductor device described in any of the above embodiments is provided in the main body 711. Consequently, the portable information terminal can perform writing and reading of data at high speed and store data for a long time with sufficiently reduced power consumption.

Figure 10E:
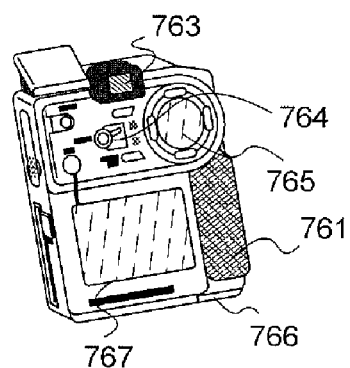
Figure 10C:
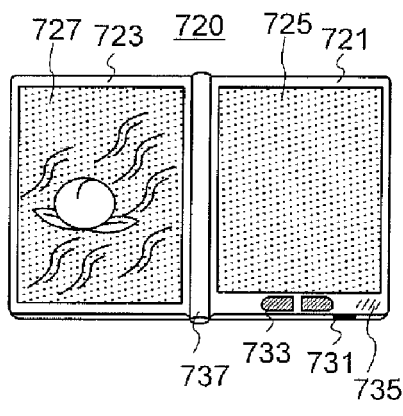

FIG. 10C is an e-book reader 720 mounting an electronic paper. The e-book reader has two housings, a housing 721 and a housing 723. The housing 721 and the housing 723 are provided with a display portion 725 and a display portion 727, respectively. The housing 721 and the housing 723 are connected by a hinge 737 and can be opened and closed along the hinge 737. Further, the housing 721 is provided with a power switch 731, operation keys 733, a speaker 735, and the like. At least one of the housing 721 and the housing 723 is provided with the semiconductor device described in any of the above embodiments. Consequently, the e-book reader can perform writing and reading of data at high speed and store data for a long time with sufficiently reduced power consumption.

FIG. 10D is a mobile phone including two housings, a housing 740 and a housing 741. Further, the housing 740 and the housing 741 in a state where they are developed as illustrated in FIG. 10D can be slid so that one is lapped over the other; therefore, the size of the mobile phone can be reduced, which makes the mobile phone suitable for being carried. The housing 741 is provided with a display panel 742, a speaker 743, a microphone 744, an operation key 745, a pointing device 746, a camera lens 747, an external connection terminal 748, and the like. The housing 740 is provided with a solar cell 749 that charges the mobile phone, an external memory slot 750, and the like. In addition, an antenna is incorporated in the housing 741. At least one of the housing 740 and the housing 741 is provided with the semiconductor device described in any of the above embodiments. Consequently, the mobile phone can perform writing and reading of data at high speed and store data for a long time with sufficiently reduced power consumption.

FIG. 10E is a digital camera including a main body 761, a display portion 767, an eyepiece 763, an operation switch 764, a display portion 765, a battery 766, and the like. The semiconductor device described in any of the above embodiments is provided in the main body 761. Consequently, the digital camera can perform writing and reading of data at high speed and store data for a long time with sufficiently reduced power consumption.

Figure 10F:
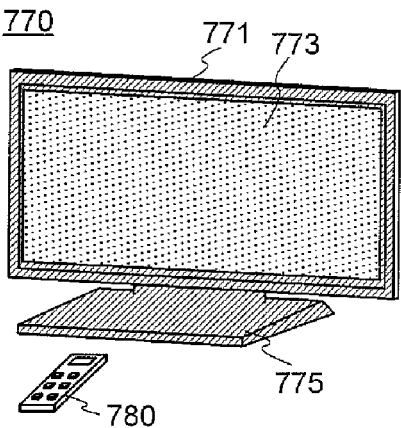

FIG. 10F is a television device 770 including a housing 771, a display portion 773, a stand 775, and the like. The television device 770 can be operated by an operation switch of the housing 771 or a remote control 780. The semiconductor device described in any of the above embodiments is mounted in the housing 771 and the remote control 780. Consequently, the television device can perform writing and reading of data at high speed and store data for a long time with sufficiently reduced power consumption.

Thus, the semiconductor device according to any of the above embodiments is mounted in the electronic devices described in this embodiment. Accordingly, electronic devices with low power consumption can be realized.

EXAMPLE 1

In this example, measurement results of the off-state current of a transistor including a purified oxide semiconductor will be described.

Figure 11:
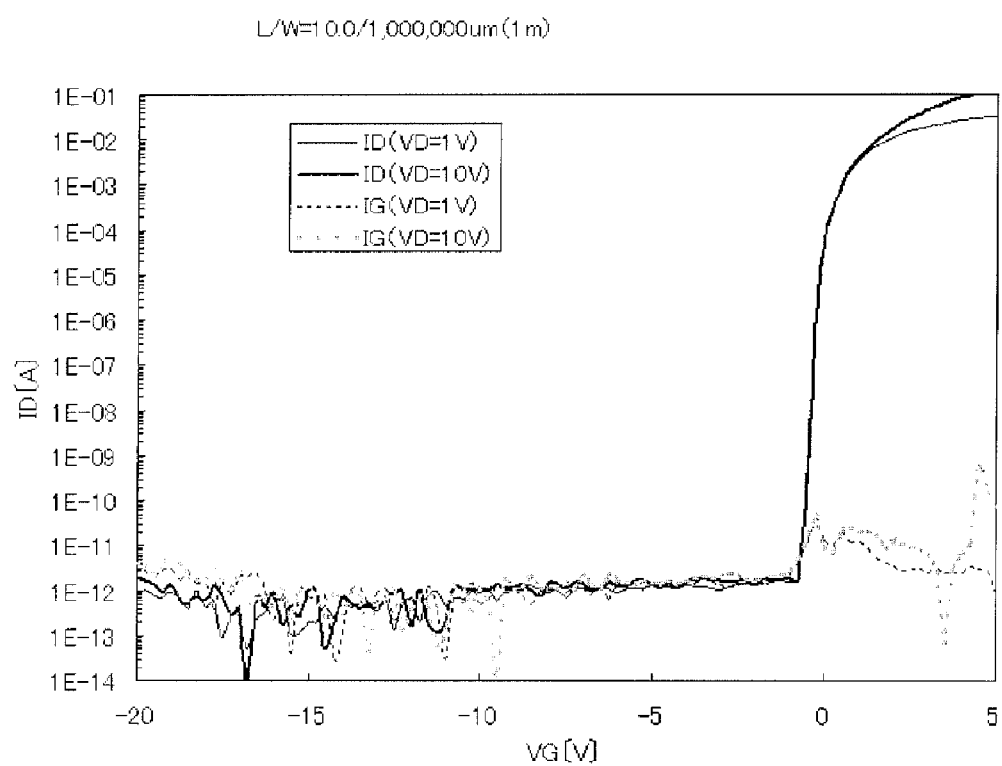
FIG. 11 is a graph showing characteristics of a transistor including an oxide semiconductor.

First, a transistor with a channel width W of 1 m, which was sufficiently large, was prepared in consideration of the fact that off-state current of a transistor including a purified oxide semiconductor is extremely small, and the off-state current was measured. FIG. 11 shows the results obtained by the measurement of the off-state current of the transistor with a channel width W of 1 m. In FIG. 11, the horizontal axis represents a gate voltage VG and the vertical axis represents a drain current ID. In the case where the chain voltage VD is +1 V or +10 V and the gate voltage VG is within the range of −5 V to −20 V, the off-state current of the transistor was found to be smaller than or equal to $1\times10^{-12}$ A, which is the detection limit. In addition, it was found that the off-state current (here, current per micrometer (μm) of channel width) of the transistor is smaller than or equal to 1 aA/μm ($1\times10^{-18}$ A/μm).

Described next are the results obtained by more accurately measuring the off-state current of the transistor including a purified oxide semiconductor. As described above, the off-state current of the transistor including a purified oxide semiconductor was found to be smaller than or equal to $1\times10^{-12}$ A, which is the detection limit of the measurement equipment. Here, the results obtained by measuring a more accurate off-state current value (the value smaller than or equal to the detection limit of the measurement equipment in the above measurement) with the use of an element for characteristic evaluation will be described.

First, the element for characteristic evaluation which was used in a method for measuring current will be described with reference to FIG. 12.

Figure 12:
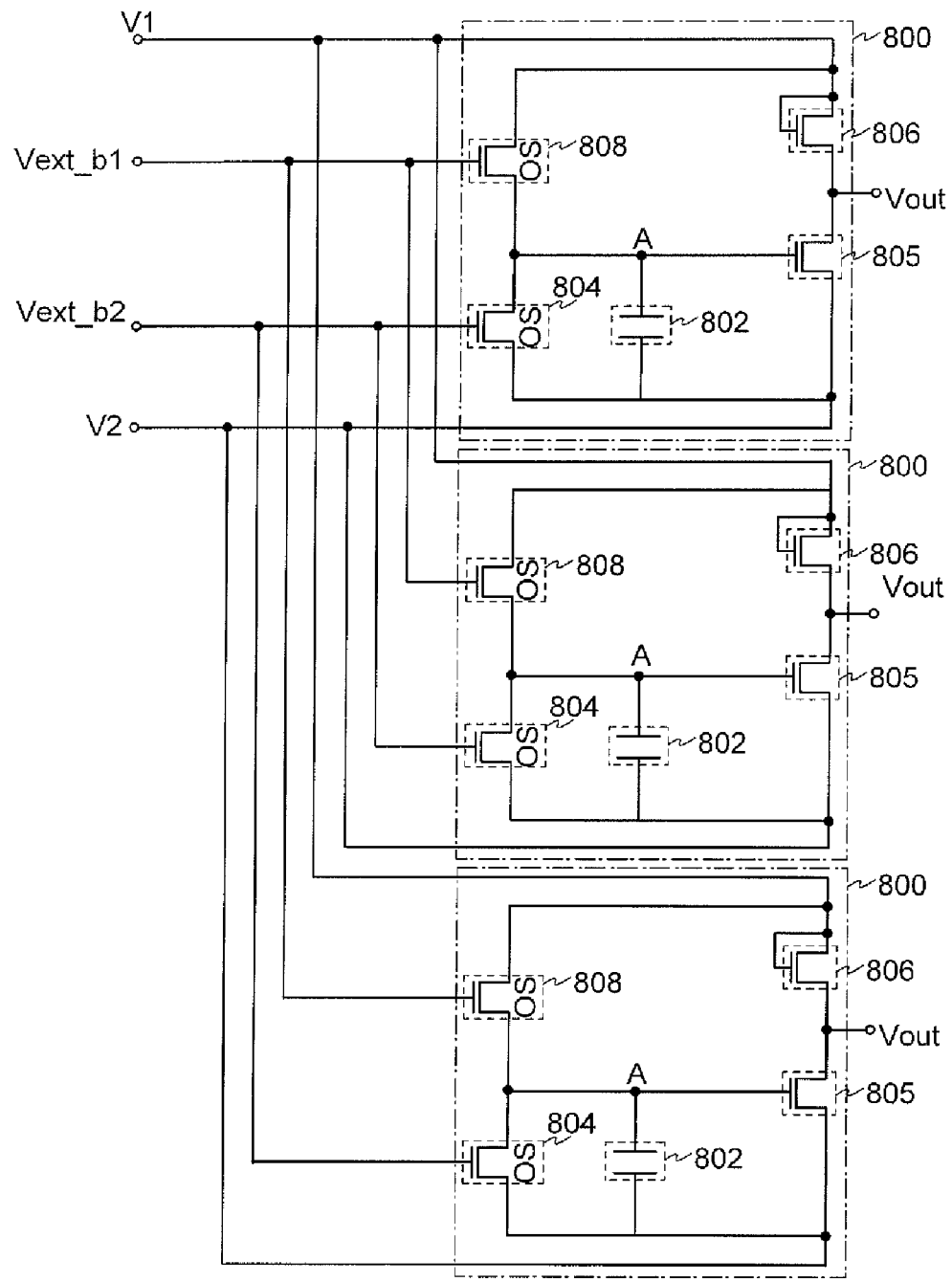
FIG. 12 is a diagram of a circuit for evaluating characteristics of a transistor including an oxide semiconductor.

In the element for characteristic evaluation in FIG. 12, three measurement systems 800 are connected in parallel. The measurement system 800 includes a capacitor 802, a transistor 804, a transistor 805, a transistor 806, and a transistor 808. A transistor including a purified oxide semiconductor was used as each of the transistor 804 and the transistor 808.

In the measurement system 800, one of a source terminal and a drain terminal of the transistor 804, one terminal of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other terminal of the capacitor 802, and a gate terminal of the transistor 805 are connected to one another. The other of the source terminal and the drain terminal of the transistor 808, one of a source terminal and a drain terminal of the transistor 806, and a gate terminal of the transistor 806 are connected to a power source (for supplying V1). The other of the source terminal and the drain terminal of the transistor 805 and the other of the source terminal and the drain terminal of the transistor 806 are connected to each other and serve as an output terminal.

A potential Vext_b2 for controlling whether the transistor 804 is turned on or off is applied to a gate terminal of the transistor 804. A potential Vext_b1 for controlling whether the transistor 808 is turned on or off is applied to the gate terminal of the transistor 808. A potential Vout is output from the output terminal.

Next, a method for measuring current with the use of the element for characteristic evaluation will be described.

First, an initialization period in which a potential difference is applied to measure the off-state current will be briefly described. In the initialization period, the potential Vext_b1 for turning on the transistor 808 is input to the gate terminal of the transistor 808, and a potential V1 is applied to a node A which is a node connected to the other of the source terminal and the drain terminal of the transistor 804 (i.e., the node connected to the one of the source terminal and the drain terminal of the transistor 808, the other terminal of the capacitor 802, and the gate terminal of the transistor 805). Here, the potential V1 is, for example, a high potential. The transistor 804 is kept in an off state.

After that, the potential Vext_b1 for turning off the transistor 808 is input to the gate terminal of the transistor 808, whereby the transistor 808 is turned off. After the transistor 808 is turned off, the potential V1 is set to a low potential. The transistor 804 is still in an off state. The potential V2 is set to the same potential as the potential V1. Thus, the initialization period is completed. When the initialization period is completed, a potential difference is generated between the node A and the one of the source electrode and drain electrode of the transistor 804, and a potential difference is also generated between the node A and the other of the source electrode and the drain electrode of the transistor 808. Accordingly, a small amount of charge flows through the transistor 804 and the transistor 808. In other words, off-state current is generated.

Next, a measurement period of the off-state current will be briefly described. In the measurement period, the potential of the one of the source terminal and the drain terminal of the transistor 804 (i.e., the potential V2) and the potential of the other of the source terminal and the drain terminal of the transistor 808 (i.e., the potential V1) are fixed to a low potential. On the other hand, the potential of the node A is not fixed (the node A is in a floating state) in the measurement period. Accordingly, charge flows through the transistor 804, and the amount of charge held in the node A changes over time. Further, as the amount of charge held in the node A changes, the potential of the node A changes. In addition, the output potential Vout of the output terminal also changes.

Figure 13:
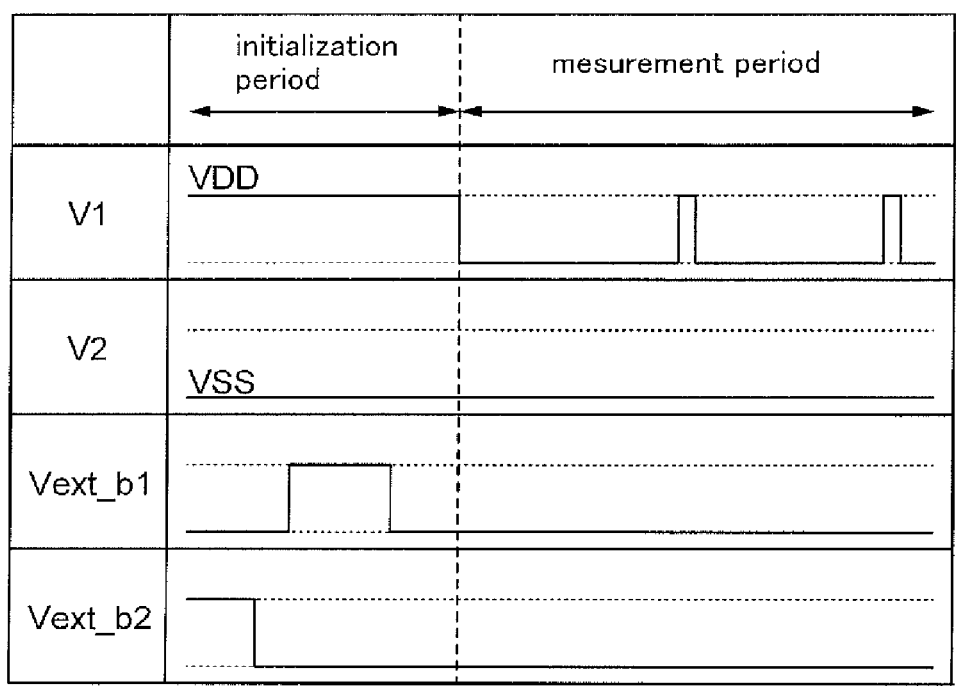
FIG. 13 is a timing diagram of the circuit for evaluating characteristics of the transistor including an oxide semiconductor.

FIG. 13 shows details (the timing diagram) of the relation between potentials in the initialization period in which the potential difference is generated and in the following measurement period.

In the initialization period, first, the potential Vext_b2 is set to a potential (a high potential) at which the transistor 804 is turned on. Thus, the potential of the node A comes to be V2, that is, a low potential (VSS). Note that it is not essential to apply the low potential (VSS) to the node A. After that, the potential Vext_b2 is set to a potential (a low potential) at which the transistor 804 is turned off, whereby the transistor 804 is turned off. Then, the potential Vext_b1 is set to a potential (a high potential) at which the transistor 808 is turned on. Thus, the potential of the node A comes to be V1, that is, a high potential (VDD). After that, the potential Vext_b1 is set to a potential at which the transistor 808 is turned off. Thus, the node A is brought into a floating state and the initialization period is completed.

In the following measurement period, the potential V1 and the potential V2 are individually set to potentials at which charge flows to or from the node A. Here, the potential V1 and the potential V2 are set to the low potential (VSS). Note that at the timing of measuring the output potential Vout, it is necessary to operate an output circuit; thus, V1 is set to the high potential (VDD) temporarily in some cases. Note that the period in which V1 is the high potential (VDD) is set to be short so that the measurement is not effected.

When a potential difference is generated and the measurement period is started as described above, the amount of charge held in the node A changes over time and the potential of the node A changes accordingly. This means that the potential of the gate terminal of the transistor 805 changes and the output potential Vout of the output terminal also changes over time.

A method for calculating the off-state current based on the obtained output potential Vout will be described below.

The relation between the potential $V_A$ of the node A and the output potential Vout is obtained before the off-state current is calculated, whereby the potential $V_A$ of the node A can be obtained based on the output potential Vout. From the relation described above, the potential $V_A$ of the node A can be expressed as a function of the output potential Vout by the following equation.

$$V_A = F(Vout) \quad \text{[Equation 1]}$$

Charge $Q_A$ of the node A is expressed by the following equation, with the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad \text{[Equation 2]}$$

Since current $I_A$ of the node A is the time derivative of charge flowing to the node A (or charge flowing from the node A), the current $I_A$ of the node A is expressed by the following equation.

$$I_A \equiv \frac{\Delta Q_A}{\Delta t} = \frac{C_A \cdot \Delta F(Vout)}{\Delta t} \qquad \text{[Equation 3]}$$

Thus, the current $I_A$ of the node A can be obtained from the capacitance $C_A$ connected to the node A and the output potential Vout of the output terminal.

By the method described above, leakage current (off-state current) flowing between a source and a drain of a transistor which is in an off state can be calculated.

In this example, the transistor 804, the transistor 805, the transistor 806, and the transistor 808 with a channel length L of 10 μm and a channel width W of 50 μm were formed using a purified oxide semiconductor. In the measurement systems 800 arranged in parallel, capacitance values of the capacitors 802 were 100 fF, 1 pF, and 3 pF.

Note that in the measurement according to this example, VDD was 5 V and VSS was 0 V. In the measurement period, Vout was measured while the potential V1 was basically set to VSS and changed to VDD only for 100 milliseconds every 10 seconds to 300 seconds. Further, Δt of calculation of current I flowing through the element was approximately 30000 seconds.

Figure 14:
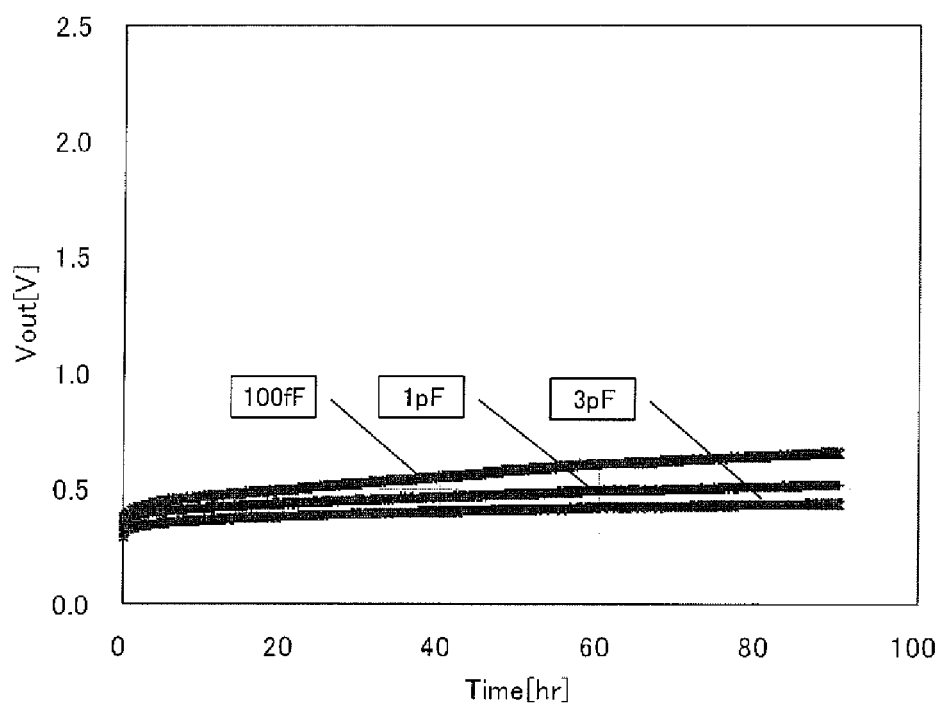
FIG. 14 is a graph showing the characteristics of the transistor including the oxide semiconductor.

FIG. 14 shows the relation between the output potential Vout and elapsed time Time in the current measurement. As is seen in FIG. 14, the potential changes over time.

Figure 15:
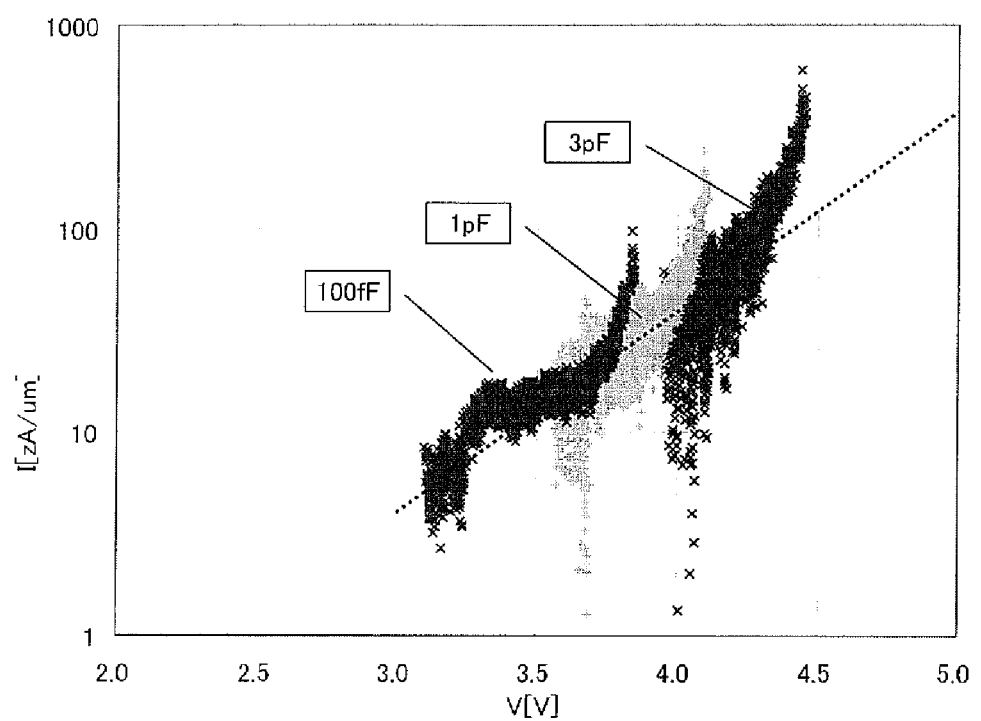
FIG. 15 is a graph showing the characteristics of the transistor including the oxide semiconductor.

FIG. 15 shows the off-state current at room temperature (25° C.) calculated based on the above current measurement. FIG. 15 shows the relation between the source-drain voltage V and the off-state current I. According to FIG. 15, the off-state current is approximately 40 zA/μm when the source-drain voltage is 4 V. In addition, the off-state current is smaller than or equal to 10 zA/μm when the source-drain voltage is 3.1 V. Note that 1 zA is equivalent to $10^{-21}$ A.

Figure 16:
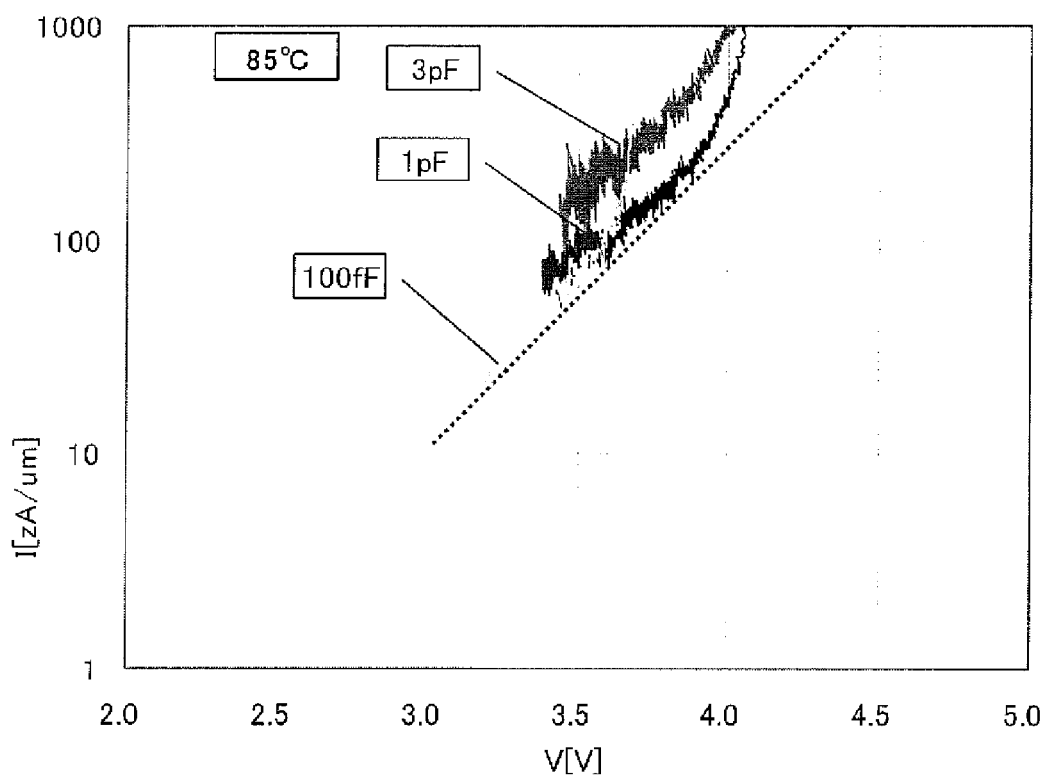
FIG. 16 is a graph showing the characteristics of the transistor including the oxide semiconductor.

Further, FIG. 16 shows the off-state current in an environment at a temperature of 85° C., which was calculated based on the above current measurement. FIG. 16 shows the relation between the source-drain voltage V and the off-state current I in an environment at 85° C. According to FIG. 16, the off-state current is smaller than or equal to 100 zA/μm when the source-drain voltage is 3.1 V.

According to this example, it was confirmed that the off-state current is sufficiently small in a transistor including a purified oxide semiconductor.

EXAMPLE 2

The number of times data can be rewritten in the semiconductor device according to one embodiment of the disclosed invention was examined. In this example, the examination results will be described with reference to FIG. 17.

A semiconductor device used for the examination is the semiconductor device having the circuit structure in FIG. 1A-1. Here, an oxide semiconductor was used in a transistor corresponding to the transistor 162, and a capacitor with a capacitance value of 0.33 pF was used as a capacitor corresponding to the capacitor 164.

The examination was performed by comparing the initial memory window width and the memory window width after storing and writing of data were repeated a predetermined number of times. Data was stored and written by applying 0 V or 5 V to a wiring corresponding to the third wiring in FIG. 1A-1 and applying 0 V or 5 V to a wiring corresponding to the fourth wiring. When the potential of the wiring corresponding to the fourth wiring is 0 V, the transistor (the write transistor) corresponding to the transistor 162 is in an off state; thus, a potential applied to the node FG is held. When the potential of the wiring corresponding to the fourth wiring is 5 V, the transistor corresponding to the transistor 162 is in an on state; thus, a potential of the wiring corresponding to the third wiring is applied to the node FG.

The memory window width is one of the indicators of the memory device characteristics. Here, the memory window width refers to the shift amount ΔVcg in curves (Vcg-ID curves) between different memory states, which show the relation between the potential Vcg of a wiring corresponding to the fifth wiring and the drain current ID of a transistor (a read transistor) corresponding to the transistor 160. The different memory states are a state where 0 V is applied to the node FG (hereinafter referred to as a Low state) and a state where 5 V is applied to the node FG (hereinafter referred to as a High state). That is, the memory window width can be obtained by sweeping the potential Vcg in the Low state and in the High state.

Figure 17:
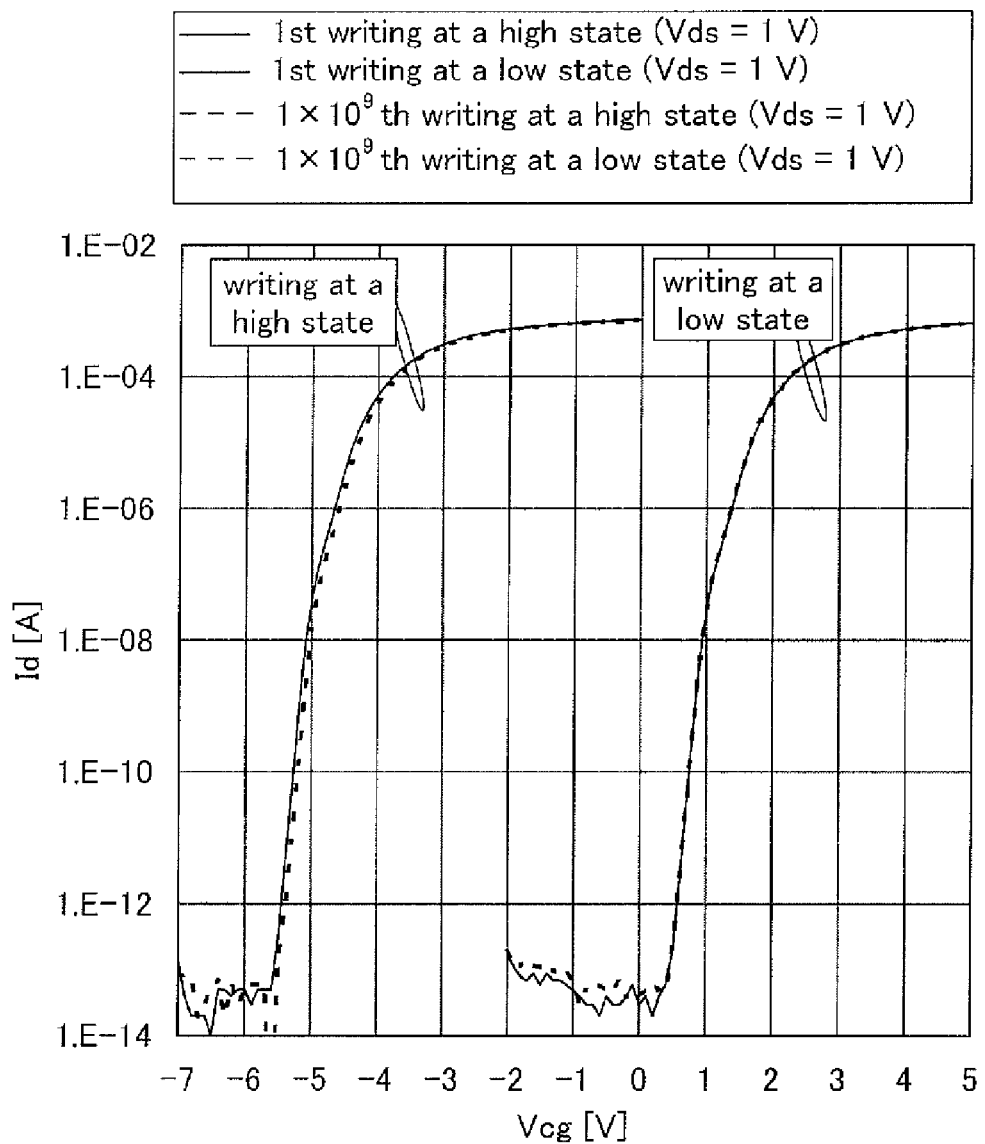
FIG. 17 is a graph showing examination results of the memory window width.

FIG. 17 shows the examination results of the initial memory window width and the memory window width after writing was performed $1 \times 10^9$ times. Note that in FIG. 17, the horizontal axis represents Vcg (V) and the vertical axis represents ID (A). According to FIG. 17, the memory window width is not changed by $1 \times 10^9$ times of data writing, which means that the semiconductor device does not deteriorate at least during the period in which data is written $1 \times 10^9$ times.

As described above, a semiconductor device according to one embodiment of the disclosed invention has very high rewriting durability and its characteristics do not change even when data is held and written $10^9$ times. That is, it can be said that a semiconductor device having excellent reliability is realized according to one embodiment of the disclosed invention.

This application is based on Japanese Patent Application serial no. 2010-028820 filed with Japan Patent Office on Feb. 12, 2010, the entire contents of which are hereby incorporated by reference.

The invention claimed is:

1. A semiconductor device comprising:
   a bit line;
   a source line;
   a potential change circuit; and
   a memory cell,
   the memory cell comprising:
      a first transistor comprising a first gate electrode, a first source electrode, a first drain electrode, and a first channel formation region including a first semiconductor;
      a second transistor comprising a second gate electrode, a second source electrode, a second drain electrode, and a second channel formation region including a second semiconductor; and
      a capacitor,
   wherein the first semiconductor is different from the second semiconductor,
   wherein the first gate electrode, the second drain electrode, and one of electrodes of the capacitor are electrically connected to each other to form a node which holds charge,
   wherein the source line, one of terminals of the potential change circuit, and the first source electrode are electrically connected to each other,
   wherein the bit line, the second source electrode, and the first drain electrode are electrically connected to each other, wherein the potential change circuit is configured to selectively apply a first potential to the source line or a second potential to the source line, and wherein the first potential is equal to a potential of the bit line and the second potential is different from the potential of the bit line.

2. The semiconductor device according to claim 1, wherein the second semiconductor is an oxide semiconductor.

3. The semiconductor device according to claim 1, wherein the potential change circuit is configured to apply the first potential to the source line, when a potential which turns the first transistor on is applied to the node.

4. A semiconductor device comprising:
a write word line:
a read word line;
a bit line;
a source line;
a potential change circuit; and
a memory cell,
the memory cell comprising:
   a first transistor comprising a first gate electrode, a first source electrode, a first drain electrode, and a first channel formation region including a first semiconductor;
   a second transistor comprising a second gate electrode, a second source electrode, a second drain electrode, and a second channel formation region including a second semiconductor; and
   a capacitor,
wherein the first semiconductor is different from the second semiconductor,
wherein the first gate electrode, the second drain electrode, and one of electrodes of the capacitor are electrically connected to each other to form a node which holds charge,
wherein the source line, one of terminals of the potential change circuit, and the first source electrode are electrically connected to each other,
wherein the bit line, the second source electrode, and the first drain electrode are electrically connected to each other,
wherein the read word line and the other of the electrodes of the capacitor are electrically connected to each other,
wherein the write word line and the second gate electrode are electrically connected to each other, and
wherein the potential change circuit is configured to selectively apply a first potential to the source line or a second potential to the source line, and
wherein the first potential is equal to a potential of the bit line and the second potential is different from the potential of the bit line.

5. The semiconductor device according to claim 4, wherein the second semiconductor is an oxide semiconductor.

6. The semiconductor device according to claim 4, wherein the potential change circuit is configured to apply the first potential to the source line, when a potential which turns the first transistor on is applied to the node.

7. A method for driving a semiconductor device in which a gate electrode of a first transistor, a drain electrode of a second transistor, and one of electrodes of a capacitor are electrically connected to form a node which holds charge, comprising:
   making a potential of a source electrode of the first transistor and a potential of a drain electrode of the first transistor equal to each other, when a potential which turns the first transistor on is applied to the node,
   wherein the second transistor comprises a channel formation region including an oxide semiconductor.

8. The method for driving a semiconductor device according to claim 7,
wherein a channel formation region of the first transistor comprises a semiconductor material different from a semiconductor material in the channel formation region of the second transistor.

9. The method for driving a semiconductor device according to claim 7,
wherein the potential of the source electrode of the first transistor and the potential of the drain electrode of the first transistor are made equal to each other by a potential change circuit controlling a potential of a source line connected to the source electrode of the first transistor.

* * * * *